(12) United States Patent
Shafer et al.

(10) Patent No.: US 8,675,276 B2
(45) Date of Patent: Mar. 18, 2014

(54) CATADIOPTRIC IMAGING SYSTEM FOR BROAD BAND MICROSCOPY

(75) Inventors: David R. Shafer, Fairfield, CT (US); Yung-Ho Chuang, Cupertino, CA (US); J. Joseph Armstrong, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1137 days.

(21) Appl. No.: 10/646,073

(22) Filed: Aug. 22, 2003

(65) Prior Publication Data

US 2004/0240047 A1   Dec. 2, 2004

Related U.S. Application Data

(63) Continuation-in-part of application No. 10/434,374, filed on May 7, 2003, now Pat. No. 7,180,658.

(60) Provisional application No. 60/449,326, filed on Feb. 21, 2003.

(51) Int. Cl.
*G02B 17/00* (2006.01)
*G02B 21/00* (2006.01)
*G02B 23/00* (2006.01)

(52) U.S. Cl.
USPC .......................................................... 359/366

(58) Field of Classification Search
USPC ................. 359/364–366, 368, 351, 355–357, 359/729–731, 858–859
See application file for complete search history.

(56) References Cited

U.S. PATENT DOCUMENTS

| 4,108,794 | A | * | 8/1978 | Yonekubo | ................. 252/408.1 |
| 4,208,101 | A |   | 6/1980 | Trapp et al. | |
| 5,369,717 | A | * | 11/1994 | Attridge | ......................... 385/12 |
| 5,825,043 | A | * | 10/1998 | Suwa | ............................ 250/548 |
| 5,999,310 | A |   | 12/1999 | Shafer et al. | |
| 6,313,467 | B1 |  | 11/2001 | Shafer et al. | |

(Continued)

FOREIGN PATENT DOCUMENTS

| JP | 53-70837 A | 6/1978 |
| JP | 5370837 | 6/1978 |

(Continued)

OTHER PUBLICATIONS

Japanese Notice of Grounds for Rejection Issued Apr. 2, 2013.

*Primary Examiner* — Stephone B Allen
*Assistant Examiner* — Tamara Y Washington
(74) *Attorney, Agent, or Firm* — Smyrski Law Group, A P.C.

(57) ABSTRACT

A system and method for inspection is disclosed. The design includes an objective employed for use with light energy having a wavelength in various ranges, including approximately 266 to 1000 nm, 157 nm through infrared, and other ranges. The objective includes a focusing lens group having at least one focusing lens configured to receive light, a field lens oriented to receive focused light energy from said focusing lens group and provide intermediate light energy, and a Mangin mirror arrangement positioned to receive the intermediate light energy from the field lens and form controlled light energy. Each focusing lens has a reduced diameter, such as a diameter of less than approximately 100 mm, and a maximum corrected field size of approximately 0.15 mm. An immersion substance, such as oil, water, or silicone gel, may be employed prior to passing controlled light energy to the specimen inspected.

57 Claims, 13 Drawing Sheets

(56) References Cited

U.S. PATENT DOCUMENTS

| | | | |
|---|---|---|---|
| 6,392,793 B1 | 5/2002 | Chuang et al. | |
| 6,757,051 B2 | 6/2004 | Takahashi et al. | |
| 6,785,051 B2 * | 8/2004 | Allan et al. | 359/499 |
| 6,842,298 B1 * | 1/2005 | Shafer et al. | 359/730 |
| 2001/0040722 A1 * | 11/2001 | Shafer et al. | 359/351 |
| 2002/0085271 A1 * | 7/2002 | Shafer et al. | 359/359 |

FOREIGN PATENT DOCUMENTS

| | | | |
|---|---|---|---|
| JP | 56-147038 A | 11/1981 | |
| JP | 56147038 | 11/1981 | |
| JP | 10177139 | 6/1998 | |
| JP | 2001-517806 A | 9/2001 | |
| JP | 2001517806 | 10/2001 | |
| JP | 2002-83766 A | 3/2002 | |
| JP | 2002083766 | 3/2002 | |
| JP | 2003-161886 A | 6/2003 | |
| JP | 2003161886 | 6/2003 | |
| JP | 10-177139 A | 8/2010 | |
| WO | WO 9908134 | 2/1999 | |
| WO | WO 0039623 | 7/2000 | |
| WO | WO 0104682 | 1/2001 | |
| WO | WO 0157563 A2 * | 8/2001 | G02B 1/04 |
| WO | WO 01/69298 | 9/2001 | |
| WO | WO 0169298 | 9/2001 | |

* cited by examiner

CATADIOPTRIC IMAGING SYSTEM FOR BROAD BAND MICROSCOPY

This application is a continuation-in-part of U.S. patent application Ser. No. 10/434,374, entitled "High Performance Catadioptric Imaging System," inventors David G. Shafer, et al., filed May 7, 2003 now U.S. Pat. No. 7,180,658, which claims the benefit of U.S. Provisional Patent Application Ser. No. 60/449,326, entitled "High Performance, Low Cost Catadioptric Imaging System," filed Feb. 21, 2003.

BACKGROUND OF THE INVENTION

1. Field of the Invention

The present invention relates generally to the field of optical imaging, and more particularly to catadioptric optical systems used for microscopic imaging, inspection, and lithography applications.

2. Description of the Related Art

Many optical systems exist having the ability to inspect or image features on the surface of a specimen. Various applications employ microscopes for imaging purposes, including biology, metrology, semiconductor inspection, and other complex inspection applications wherein high resolution images of small areas and/or features are desired. Microscopes employ various imaging modes to enhance the appearance of desired features on the specimen. Imaging modes may include bright field, dark field, differential interference contrast, confocal, immersion, and others.

In many circumstances, a microscope capable of broad band imaging that also supports light energy in the ultraviolet (UV) wavelength can be highly advantageous. One example of this type of imaging is called optical coherence tomography (OCT). OCT uses a broadband microscope to provide high resolution cross-sectional imaging of biological tissues. In an OCT design, the coherence length of the light employed governs the longitudinal resolution of the image, and light coherence length is inversely proportional to the bandwidth of the light. In an imaging design that performs broad band imaging and supports light energy in the UV wavelength range can provide improved lateral and longitudinal resolutions of the resultant image.

The imaging objective is one particular optical component that enables the microscope to perform broad band imaging while simultaneously supporting light wavelengths below 400 nm. Certain UV objectives are capable of transmitting light down to a wavelength of 340 nm, but these objectives do not provide accurate imaging performance for light wavelengths below 400 nm. These types of objectives are mainly used for fluorescence, where wavelengths from 340 nm through the visible light spectrum excite fluorescence components in marker dyes. Fluorescence type imaging is typically employed in the visible light spectrum, so imaging performance in the visible light spectrum is the specific type of performance required.

Few objectives are available that provide broad band performance at wavelengths below 400 nm. Of the available objectives, none can be used in a standard microscope system. They are either too large, have insufficient numerical aperture (NA), or have an insufficient field size.

With respect to NA, the NA of an objective represents the objective's ability to collect light and resolve fine specimen detail at a fixed object distance. Numerical aperture is measured as the sine of the vertex angle of the largest cone of meridional rays that can enter or leave the optical system or element, multiplied by the refractive index of the medium in which the vertex of the cone is located. A large numerical aperture provides distinct advantages during inspection, not the least of which is an ability to resolve smaller features of the specimen. Also, high NAs collect a larger scattering angle, thereby improving performance in darkfield environments.

Two patents that disclose broad band, highly UV corrected, high numerical aperture (NA) catadioptric systems are U.S. Pat. No. 5,717,518 to Shafer et al. and U.S. Pat. No. 6,483,638 to Shafer et al. A representative illustration of a catadioptric design 100 in accordance with the teachings of the '518 patent is presented in FIG. 1, which is similar to FIG. 1 of the '518 patent. A representative illustration of a catadioptric design 200 in accordance with the teachings of the '638 patent is presented in FIG. 2, which has similarities to FIG. 4 of the '638 patent.

U.S. Pat. No. 5,717,518 to Shafer et al. discloses an imaging design capable of high NA, ultra broadband UV imaging. The high NA (up to approximately 0.9) system can be used for broadband bright field and multiple wavelength dark-field imaging. Certain issues exist with designs similar to that presented in FIG. 1. First, the field lens group may need to be physically located within a central hole in the large curved catadioptric element, which can make manufacturing difficult and expensive. Second, the field lens elements in such a design may require at least one glued interface. In the presence of wavelengths less then 365 nm, reliable glues that can withstand light intensity levels at an internal focus are generally unavailable. Third, the lens elements in such a design may be located very close to a field plane, thereby requiring a high degree of, or nearly perfect, surface quality and bulk material quality to prevent image degradation. Fourth, element diameters are typically larger than a standard microscope objective, especially for the catadioptric group. Large diameter elements frequently make integration into an inspection system difficult and can increase manufacturing costs.

The design of FIG. 2 is generally capable of high NA, ultra broadband UV imaging. The design is a high NA (up to approximately 0.9) imaging system that can be used for broadband bright field and multiple wavelength dark-field imaging and can use a varifocal tube lens to provide a large range of magnifications. The FIG. 2 design introduces very tight tolerances in the field lens group, due in part to increased on-axis spherical aberration produced by the catadioptric group. This on-axis spherical aberration must be corrected by the following refractive lens elements. The design of FIG. 2 is relatively large, thereby generally requiring complicated optomechanical mounting of elements, especially in the catadioptric group.

With regard to the high NA designs of FIG. 1 and FIG. 2, microscopes place several significant constraints on the objectives employed. Distance from the specimen to the mounting flange is typically in the range of 45 mm, while most objective turrets limit the objective diameter to 40 mm. Threads used to screw the objective into the microscope turret are typically either 20 mm, 25 mm, or 32 mm. Many microscope objectives employ all refractive design approaches, where all components are refractive elements. If an all refractive design is employed, the wavelength range used is limited by the available glass materials.

Other optical arrangements have been developed to perform specimen inspection in the microscopy field, but each arrangement tends to have certain specific drawbacks and limitations. Generally, in a high precision inspection environment, an objective with a short central wavelength provides advantages over those with long central wavelengths. Shorter wavelengths can enable higher optical resolution and improved defect detection, and can facilitate improved defect isolation on upper layers of multi-layer specimens, such as semiconductor wafers. Shorter wavelengths can provide improved defect characterization. An objective that can cover as large a wavelength range as possible may also be desirable, particularly when using an arc lamp as an illumination source. An all refractive objective design is difficult in this wavelength range because few glass materials having high transmission are effective for chromatic correction. A small bandwidth may not be desirable for inspection applications due to limitation of available light power and increased interference from thin films on the surface being inspected.

Small objectives are also desirable, as small objectives can be used in combination with standard microscope objectives and physically fit within standard microscope turrets. The standard objective flange-to-object distance is in the range of 45 mm. The available catadioptric objectives frequently cannot satisfy this requirement, so special microscope systems can be employed having an objective flange-to-object distance in excess of 60 mm and having lens diameters greater than 60 mm. Certain of these smaller objectives have NAs limited to 0.75 and field sizes limited to 0.12 mm with a bandwidth less than 10 nm. Such designs typically use a Schwartzchild approach with lenses added within the catadioptric group in an effort to improve performance. Working distances are typically greater than 8 mm. Using a shorter working distance with this type of design approach can somewhat reduce the objective diameter at the cost of increasing central obscuration, significantly degrading objective performance.

An objective having low intrinsic aberrations is also desirable, as is an objective that is largely self-corrected for both monochromatic and chromatic aberrations. A self corrected objective will have looser alignment tolerances with other self corrected imaging optics. An objective with loose manufacturing tolerances, such as lens centering tolerances, may be particularly beneficial. Further, reducing incidence angles on lens surfaces can have a large effect on optical coating performance and manufacturing. In general, lower angles of incidence on lens surfaces also produce looser manufacturing tolerances.

It would be beneficial to provide a system for use in microscopy that overcomes the foregoing drawbacks present in previously known systems and provide an optical inspection system design having improved functionality over devices exhibiting those negative aspects described herein.

SUMMARY OF THE INVENTION

According to a first aspect of the present design, there is provided an objective employed for use with light energy having a wavelength in a range of approximately 266 to 1000 nanometers. The objective comprises a focusing lens group comprising at least one focusing lens configured to receive said light energy and form focused light energy, a field lens oriented to receive focused light energy from said focusing lens group and provide intermediate light energy, and a Mangin mirror arrangement positioned to receive the intermediate light energy from the field lens and form controlled light energy. Each focusing lens has a diameter of less than approximately 100 millimeters and a maximum corrected field size of approximately 0.15 mm.

According to a second aspect of the present design, there is provided an objective employed for use with light energy having a wavelength in the range of approximately 157 nanometers through the infrared light range. The objective comprises a focusing lens group configured to receive said light energy and comprising at least one focusing lens, wherein each focusing lens in the focusing lens group has diameter less than approximately 100 millimeters, at least one field lens oriented to receive focused light energy from said focusing lens group and provide intermediate light energy, each field lens having diameter less than approximately 100 millimeters, and a Mangin mirror arrangement positioned to receive the intermediate light energy from the field lens and form controlled light energy, said Mangin mirror arrangement imparting the controlled light energy to a specimen with a numerical aperture in excess of 0.65 and a field size of approximately 0.15 mm.

According to a third aspect of the present design, there is provided an objective constructed of a single glass material for use with light energy having a wavelength in the range of approximately 157 nanometers through the infrared light range. The objective comprises at least one focusing lens having diameter less than approximately 100 millimeters receiving said light energy and transmitting focused light energy, at least one field lens having diameter less than approximately 100 millimeters, receiving said focused light energy and transmitting intermediate light energy, and at least one Mangin mirror element having diameter less than 100 millimeters receiving said intermediate light energy and providing controlled light energy through an immersion substance to a specimen.

According to a fourth aspect of the present design, there is provided an objective constructed of a single glass material for use with light energy having a wavelength in the range of approximately 157 nanometers through the infrared light range. The objective comprises at least one focusing lens having diameter less than approximately 100 millimeters receiving said light energy and transmitting focused light energy, at least one field lens having diameter less than approximately 100 millimeters, receiving said focused light energy and transmitting intermediate light energy, and at least one Mangin mirror element having diameter less than 100 millimeters receiving said intermediate light energy and providing controlled light energy through an immersion substance to a specimen.

According to a fifth aspect of the present design, there is provided a method for inspecting a specimen. The method comprises providing light energy having a wavelength in the range of approximately 157 nanometers through the infrared light range, focusing said light energy using at least one lens into focused light energy, where each lens used in said focusing has diameter less than approximately 100 millimeters, receiving said focused light energy and converting said focused light energy into intermediate light energy, and receiving said intermediate light energy and providing controlled light energy through an immersion substance to a specimen.

These and other aspects of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which.

DETAILED DESCRIPTION OF THE INVENTION

Figure 1:
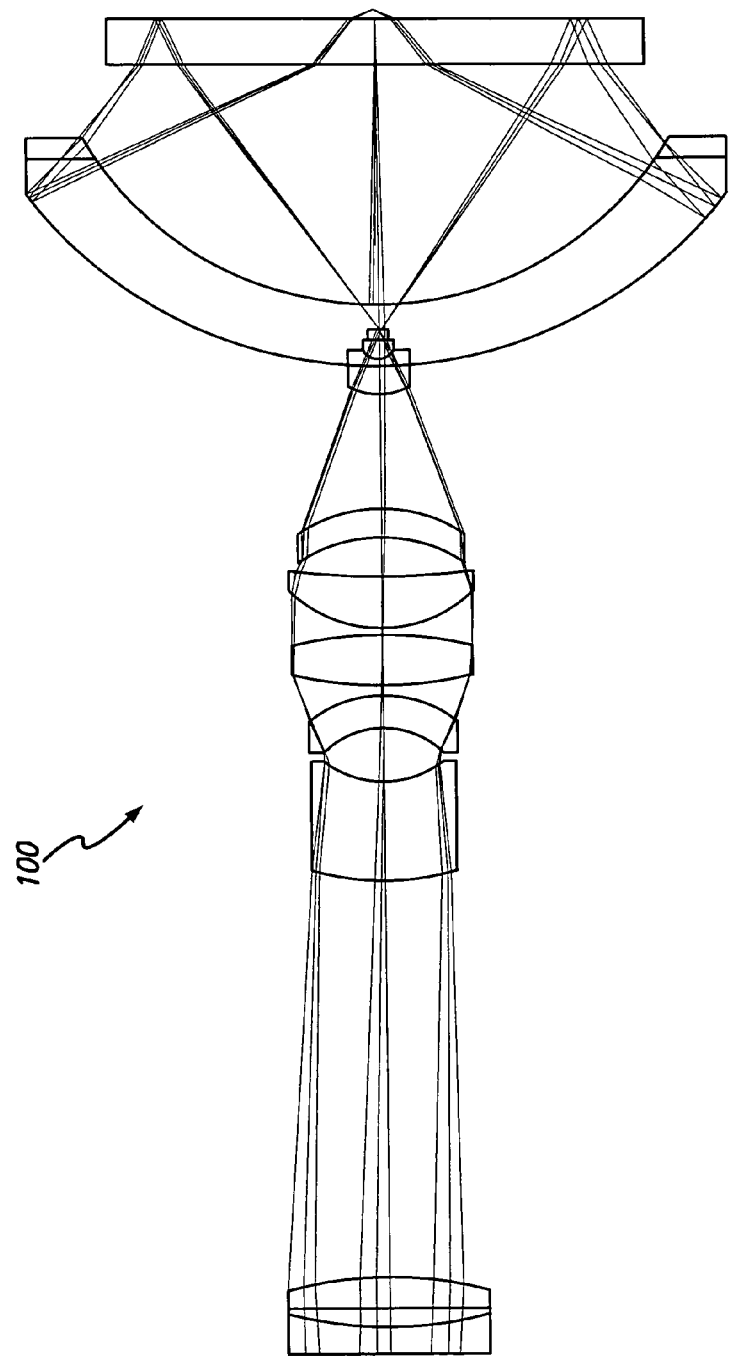
FIG. 1 illustrates an aspect of the catadioptric objective design similar to that presented in FIG. 1 of U.S. Pat. No. 5,717,518.
Figure 2:
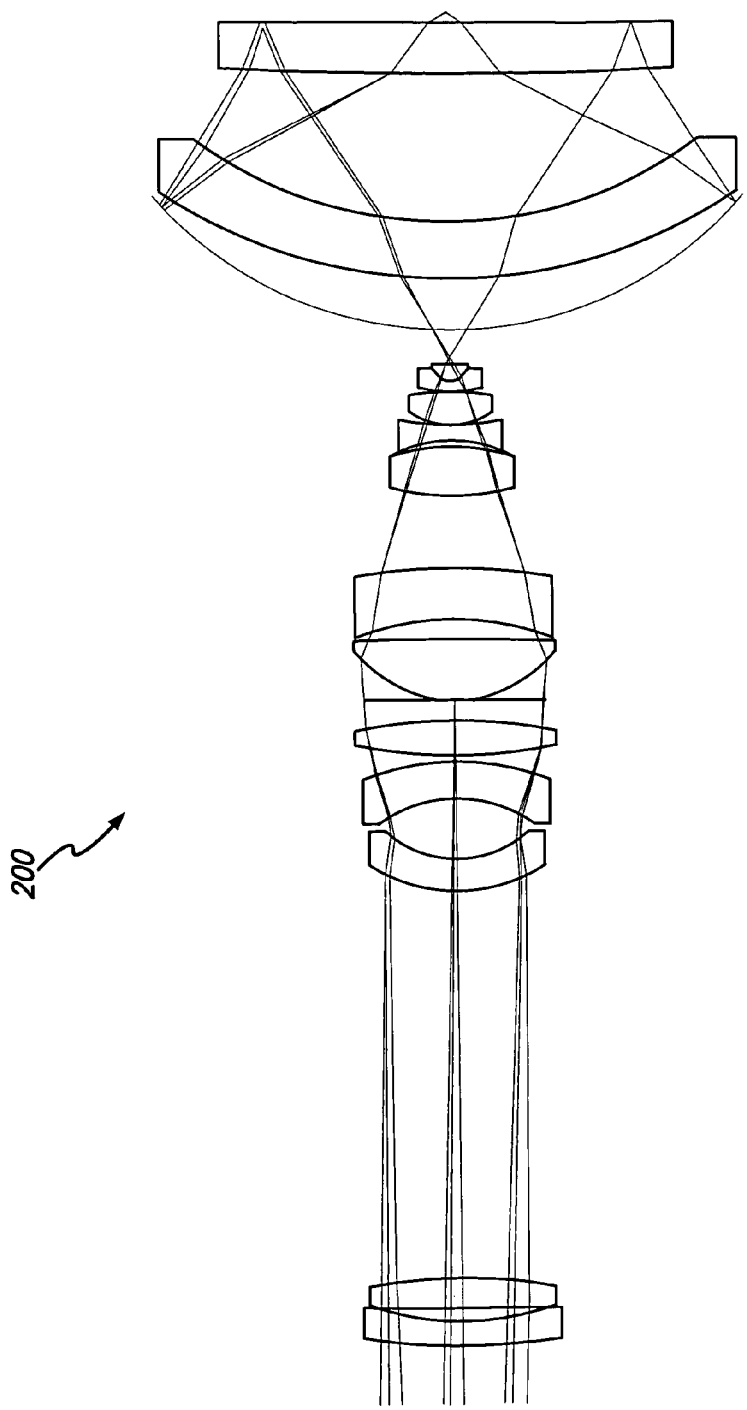
FIG. 2 is an aspect of the catadioptric objective design similar to that presented in FIG. 4 of U.S. Pat. No. 6,483,638.
Figure 3:
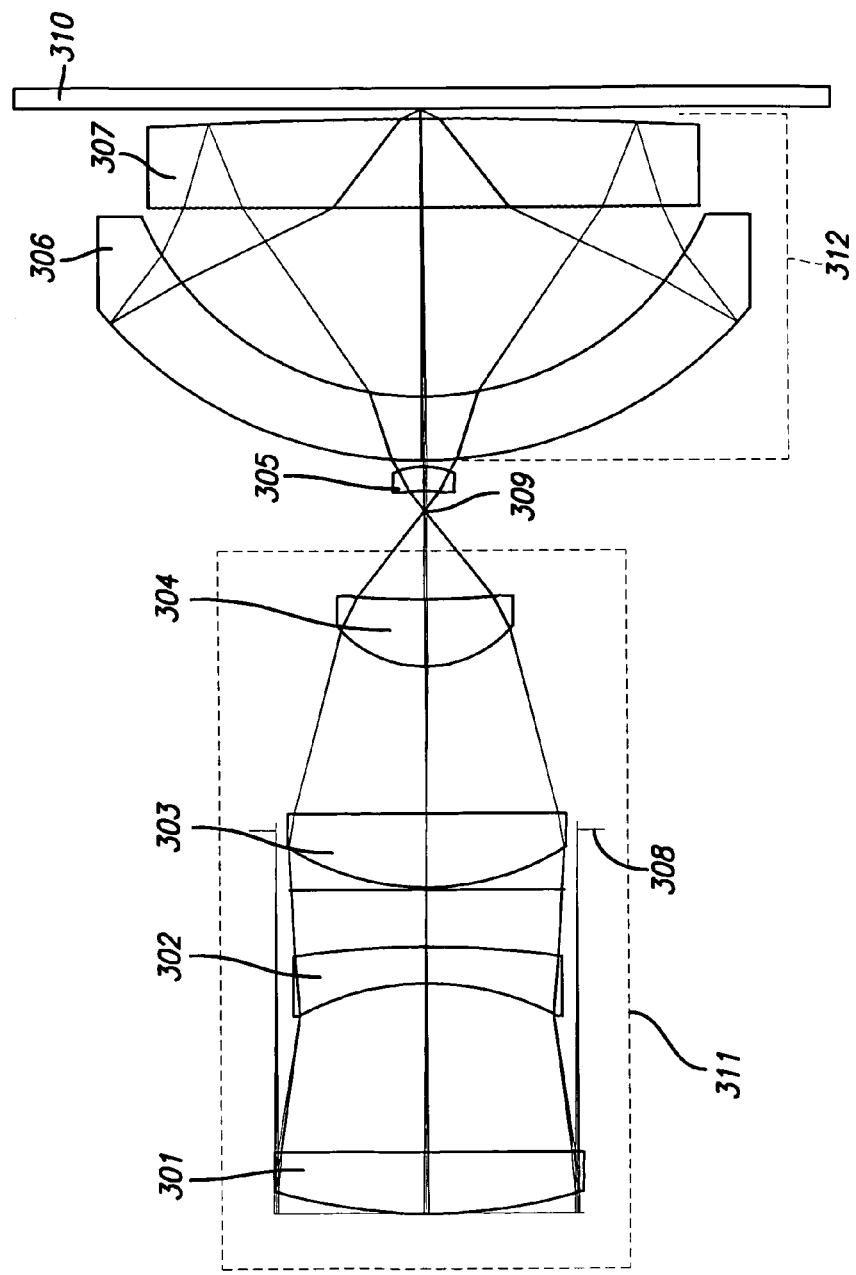
FIG. 3 presents a seven element reduced size catadioptric objective with a high NA in accordance with the present design.

The present design presents a catadioptric objective corrected over a wavelength range from 266-1000 nm using a single glass material, or in certain circumstances, more than one glass material to improve performance. The objective employed herein may provide particular benefits in the microscopy field. One aspect of the objective design is shown in FIG. 3. The catadioptric objective as shown in FIG. 3 is optimized for broad-band imaging in the UV and visible spectral region, namely approximately 0.266 to 1.000 micron wavelengths. The objective provides relatively high numerical apertures and large object fields. The inventive design presented uses the Schupmann principle in combination with an Offner field lens to correct for axial color and first order lateral color. As shown in the aspect presented in FIG. 3, the field lens group 305 is slightly displaced from the intermediate image 309 to obtain enhanced performance.

From FIG. 3, the catadioptric group 312 or Mangin mirror arrangement includes a Mangin mirror element 307. Mangin mirror element 307 is a reflectively coated lens element. The catadioptric group 312 also includes and a concave spherical reflector 306, also a reflectively coated lens element. Both elements in the catadioptric group 312 have central optical apertures where reflective material is absent. This allows light to pass from the object or specimen 310 through Mangin mirror element 307, reflect from the second or inner surface of concave spherical reflector 306, onto the reflective surface of Mangin mirror element 307, and through concave spherical reflector 306 to form an intermediate image 309 after concave spherical reflector 306 and field lens group 305. The field lens group 305 may comprise one or more lenses, and the aspect shown in FIG. 3, one field lens is employed in the field lens group 305.

The focusing lens group 311 uses multiple lens elements, in the aspect shown four lens elements 301, 302, 303, 304. All lenses in the focusing lens group 311 may be formed from a single type of material to collect the light from the field lens group 305 and the intermediate image 309.

The lens prescription for the aspect of the invention illustrated in FIG. 3 is presented in Table 1.

TABLE 1

Prescription for lenses for the design of FIG. 3

| Surf | Radius | Thickness | Glass |
|---|---|---|---|
| OBJ | Infinity | Infinity | |
| 1 | Infinity | 15.612 | |
| STO | Infinity | −15.612 | |
| 3 | 21.214 | 2.500 | FUSED SILICA |
| 4 | Infinity | 6.866 | |
| 5 | −10.633 | 1.500 | FUSED SILICA |
| 6 | −36.469 | 2.334 | |
| 7 | Infinity | 0.100 | |
| 8 | 10.162 | 3.000 | FUSED SILICA |
| 9 | Infinity | 5.985 | |
| 10 | 4.481 | 2.750 | FUSED SILICA |
| 11 | 30.793 | 4.432 | |
| 12 | −5.645 | 1.000 | FUSED SILICA |
| 13 | −2.872 | 0.250 | |
| 14 | 16.802 | 2.593 | FUSED SILICA |
| 15 | 12.273 | 7.711 | |
| 16 | Infinity | 3.603 | FUSED SILICA |
| 17 | −181.041 | −3.603 | MIRROR |
| 18 | Infinity | −7.711 | |
| 19 | 12.273 | −2.593 | FUSED SILICA |
| 20 | 16.802 | 2.593 | MIRROR |
| 21 | 12.273 | 7.711 | |
| 22 | Infinity | 3.603 | FUSED SILICA |
| 23 | −181.041 | 0.375 | |
| IMA | Infinity | | |

As may be appreciated by one skilled in the art, the numbers in the leftmost column of Table 1 represent the surface number counting surfaces from the left of FIG. 3. For example, the left surface of lens 301 in the orientation presented in FIG. 3 (surface 3 in Table 1) has a radius of curvature of 21.214 mm, a thickness of 2.5 mm, and the rightmost surface (surface 4) has a radius of curvature of infinity, and is 6.866 mm from the next surface. The material used is fused silica.

In the design presented in FIG. 3, the numerical aperture may approach or even exceed approximately 0.90. The design presented herein, including the aspect illustrated in FIG. 3, provides a maximum numerical aperture in all cases in excess of 0.65.

From FIG. 3, the focusing lens group 311 has the ability to receive light energy and transmit focused light energy. The field lens group 305 has the ability to receive the focused light energy and provide intermediate light energy, and form intermediate image 309. The catadioptric group or Mangin mirror arrangement 312 receives the intermediate energy and provides controlled light energy to the specimen. Alternately, the reflected path originates at the specimen, and light reflected from the specimen is received by the catadioptric group or Mangin mirror arrangement 312 and forms and transmits reflected light energy. The field lens group 305 receives the reflected light energy and transmitting resultant light energy, and the focusing lens group receives resultant light energy and transmits focused resultant light energy. The entrance pupil 308 represents an image of the internal pupil located within the objective. An aperture or mask can be placed at this entrance pupil 308 to limit or modify the NA of the objective.

The design presented in FIG. 3 and Table 1 thus uses a single glass material, fused silica. Other materials may be employed, but it is noted that fused silica or any material used within the design may require low absorption over a wide range of wavelengths from 190 nm through the infrared wavelength. Use of fused silica can enable the design to be re-optimized for any center wavelength in this wavelength range. For example, the design can be optimized for use with lasers at 193, 198.5, 213, 244, 248, 257, 266, 308, 325, 351, 355, or 364 nm. The design can also be optimally employed to cover lamp spectral bands from 190-202, 210-220, 230-254, 285-320, and 365-546nm. In addition, if calcium fluoride is employed as the glass or lens material, the design can be employed with an excimer laser at 157 nm or excimer lamps at 157 or 177 nm. Re-optimization requires tuning or altering components within the abilities of those skilled in the art. Calcium fluoride lenses may also be employed in the field lens group to increase the bandwidth of the objective, a modification discussed generally in U.S. Pat. No. 5,717,518.

Figure 13:
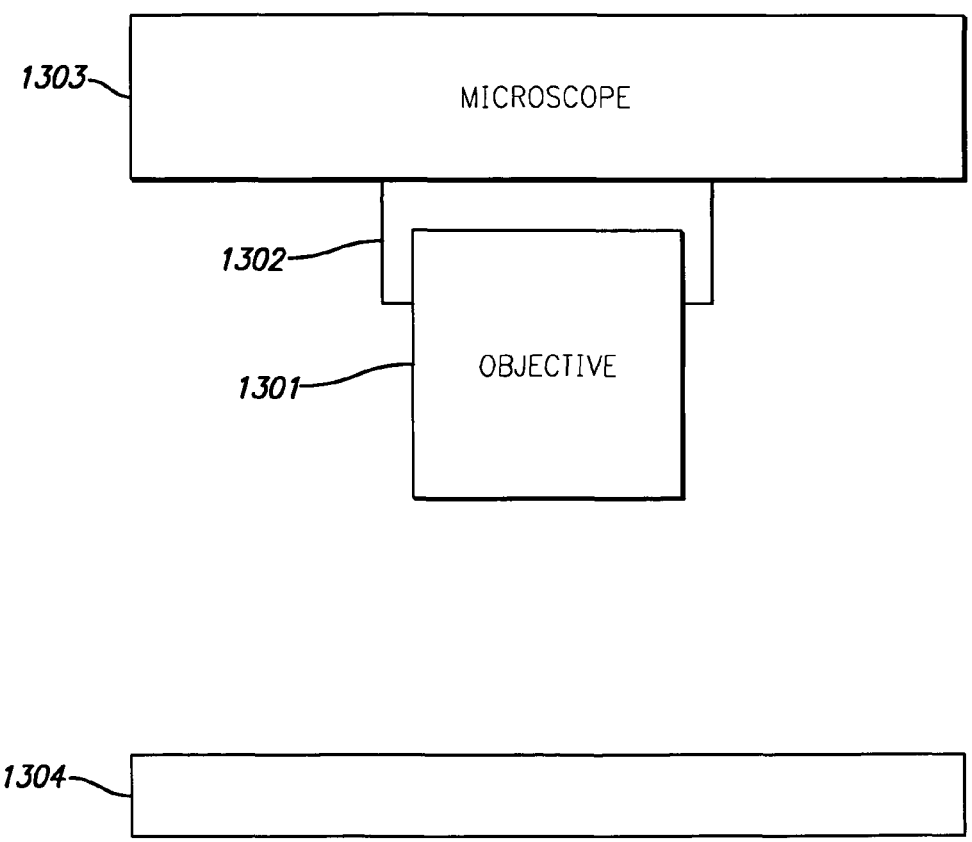
FIG. 13 conceptually represents use of an objective in a flange in a microscope.

The maximum diameter of an objective element is 26 millimeters, which is significantly smaller than objectives previously employed in this wavelength range. The small size of this objective is particularly beneficial in view of the performance characteristics of the objective. The objective can be mounted in a standard microscope turret with an approximate 45 mm flange-to-object separation. A conceptual drawing (not to scale) of an objective 1301, a flange 1302, and a microscope 1303 is illustrated in FIG. 13, where the flange in the aforementioned situation is approximately 45 mm from specimen 1304. The objective supports a numerical aperture of approximately 0.90, a field size of approximately 0.4 mm, has a corrected bandwidth from approximately 285-313 nm, and a polychromatic wavefront error of less than approximately 0.067 waves.

Field size in this arrangement represents the size of the area on the specimen that can be imaged the system with minimum degradation in optical performance. Generally, larger field sizes are beneficial in many applications.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible. Optimizing for higher NAs is also possible. Optimizing the design for higher NAs would generally limit the field size or bandwidth and may require slightly increased diameter objective elements. The design of FIG. 3 has a field size of 0.150 mm in diameter.

The design of FIG. 3 provides a relatively low intrinsic polychromatic wavefront aberration over the design bandwidth from approximately 266-1000 nm. The low wavefront aberration provides increased manufacturing headroom, or ease of manufacture, while enabling relatively high performance of the manufactured objective. The design is also self corrected. Self corrected in this context means that the objective does not require any additional optical components to correct aberrations in order to achieve design specifications. The ability to self correct can provide for simpler optical testing metrology and optical alignment to other self corrected imaging optics. Further correction of residual aberrations using additional imaging optics is also possible. This can increase the optical specifications such as bandwidth or field size.

One advantage of the present design is relatively loose manufacturing tolerances. Specifically, the decenter tolerances of individual lenses are relatively loose. Having loose decenter tolerances for individual lens elements tends to simplify the manufacturing requirements of the system. Any lens decenters encounterd during manufacturing may cause on-axis coma, a phenomenon that can be difficult to compensate without introducing other residual aberrations. Using the present design, it is possible to reduce the decenter sensitivity of the lens and mirror elements by carefully balancing the aberrations within the catadioptric group 312 and focusing lens group 311. Total aberrations of the catadioptric group may be optimized using the design of FIG. 3 to balance the compensation required by the field lens group 305 and focusing lens group 311.

Regarding decenter sensitivity for the objective, a 10 micron decenter, without any compensators, introduces less than approximately 0.27 waves of aberration in all elements. The catadioptric group 312 is particularly insensitive in that a 10 micron decenter of element 306 and 307 introduces less than 0.15 waves of error. In the design presented in FIG. 3, average tolerance is approximately 0.15 waves of error at approximately 313 nm. Further balancing of tolerances on the elements in the catadioptric group 312 is also possible to enhance decenter sensitivity performance.

Decenter tolerances tend to scale with the wavelength employed due to optical path errors introduced for small decenters being roughly linear with wavelength. For example, if a 10 micron decenter introduces 0.2 waves of aberration at a 266 nm wavelength, operation is equivalent to an approximate 0.0532 micron optical path error. A system operating at 365 nm would only introduce 0.15 waves of aberration for the same decenter, providing a similar approximate 0.0532 micron optical path error.

The foregoing decenter tolerances tend to be looser than other catadioptric designs in similar environments, and tend to be looser than most standard refractive objective designs. The design of FIG. 3 also has relatively loose tolerances on the index of the glass material, largely due to use of a single material that does not rely on the index difference of two different glass materials to compensate for chromatic aberrations. Use of a single material also makes the design relatively insensitive to temperature changes. Previous designs have used multiple glass materials with different index profiles for color correction. The result is the index profile for each material changing differently with temperature, thereby changing the chromatic correction for temperatures other than the design temperature and reduced overall performance.

The objective design presented herein can support various modes of illumination and imaging. Modes supported can include bright field and a variety of dark field illumination and imaging modes. Other modes such as confocal, differential interference contrast, polarization contrast may also be supported using the present design.

Bright field mode is commonly used in microscope systems. The advantage of bright field illumination is the clarity of the image produced. Using bright field illumination with an objective such as that presented herein provides a relatively accurate representation of object feature size multiplied by the magnification of the optical system. The objective and optical components presented herein can be readily used with image comparison and processing algorithms for computerized object detection and classification. Bright field mode typically uses a broad band incoherent light source, but it may be possible to use laser illumination sources with slightly modified illumination system components and employing the design presented herein.

The confocal mode has been used for optical sectioning to resolve height differences of object features. Most imaging modes have difficulty detecting changes in the height of features. The confocal mode forms separate images of object features at each height of interest. Comparison of the images then shows the relative heights of different features. Confocal mode may be employed using the design presented herein.

Dark field mode has been used to detect features on objects. The advantage of the dark field mode is that flat specular areas scatter very little light toward the detector, resulting in a dark image. Surface features or objects protruding above the object tend to scatter light toward the detector. Thus, in inspecting objects like semiconductor wafers, dark field imaging produces an image of features, particles, or other irregularities on a dark background. The present design may be employed with dark field mode illumination. Dark field mode provides a large resultant signal upon striking small features that scatter light. This large resultant signal allows larger pixels to be employed for a given feature size, permitting faster object inspections. Fourier filtering can also be used to minimize the repeating pattern signal and enhance the defect signal to noise ratio during dark field inspection.

Many different dark field modes exist, each including a specific illumination and collection scheme. Illumination and collection schemes can be chosen such that the scattered and diffracted light collected from the object provides an acceptable signal-to-noise ratio. Certain optical systems use different dark field imaging modes including ring dark field, laser directional dark field, double dark field, and central dark ground. Each of these dark field imaging modes may be employed in the present design.

Figure 4:
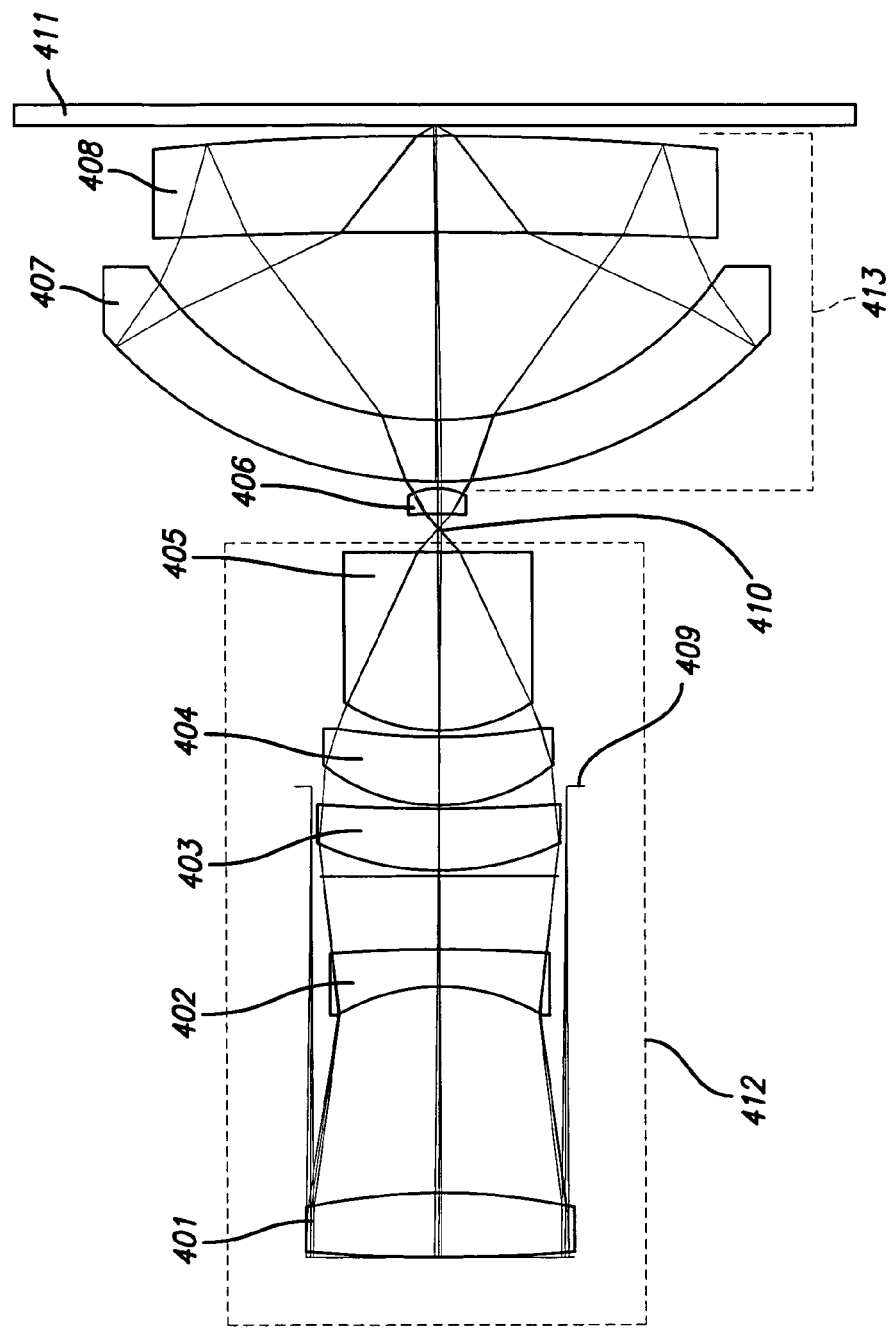
FIG. 4 presents an eight element reduced size catadioptric objective with a high NA in accordance with the present design, corrected over a bandwidth from 266 to 1000 nm and having a field size of approximately 0.150 mm.

An alternate aspect of the present design presents an objective with eight separate elements. This aspect of the design is presented in FIG. 4. One difference between the design of FIG. 4 and that of FIG. 3 is the addition of an extra element in contrast to reduced design tolerances. The objective of the design of FIG. 4 is corrected over a bandwidth from approximately 266 to 1000 nm has a field size of approximately 0.150 mm. The design of FIG. 4 maintains the high approximately 0.90 numerical aperture. The worst case polychromatic wavefront error for the FIG. 4 design is approximately 0.062 waves.

From FIG. 4, the catadioptric group 413 includes a Mangin mirror element 408, which is a reflectively coated lens element, and a concave spherical reflector 407, which is also a reflectively coated lens element. Both Mangin mirror element 408 and concave spherical reflector 407 have central optical apertures where reflective material is absent. The absence of reflective material, in the center of the components shown, allows light to pass from the object or specimen 411 through Mangin mirror element 408, reflect from the second surface of concave spherical reflector 407 onto the Mangin mirror element 408, and transmit through concave spherical reflector 407 to form an intermediate image 410 after concave spherical reflector 407 and field lens group 406, comprising a single field lens in this aspect of the design.

The focusing lens group 412 employs multiple lens elements, in this aspect the five lens elements 401, 402, 403, 404, and 405, which may all be formed from a single type of material. The focusing lens group 412 collects light from the field lens group 406, including the intermediate image 410. The entrance pupil 409 is the image of the internal pupil within the objective. An aperture or mask can be placed at the entrance pupil 409 to limit or modify the NA of the objective. The design presented in FIG. 4 has the advantages and flexibility described with respect to the design of FIG. 3. The lens prescription for this embodiment is shown in Table 2.

TABLE 2

Prescription for lenses for the design of FIG. 4

| Surf | Radius | Thickness | Glass | Diameter |
|---|---|---|---|---|
| OBJ | Infinity | Infinity | | 0.0 |
| 1 | Infinity | 18.442 | | 10.5 |
| STO | Infinity | −18.442 | | 10.0 |
| 3 | 61.412 | 2.500 | FUSED SILICA | 10.5 |
| 4 | −26.873 | 8.264 | | 10.4 |
| 5 | −7.688 | 1.500 | FUSED SILICA | 8.1 |
| 6 | −49.641 | 2.881 | | 8.6 |
| 7 | Infinity | 0.220 | | 9.2 |
| 8 | 10.794 | 2.500 | FUSED SILICA | 9.5 |
| 9 | 74.618 | 0.100 | | 9.2 |
| 10 | 7.061 | 2.750 | FUSED SILICA | 9.0 |
| 11 | 22.966 | 0.250 | | 8.1 |
| 12 | 6.520 | 7.180 | FUSED SILICA | 7.4 |
| 13 | −11.605 | 1.484 | | 2.0 |
| 14 | −5.176 | 1.000 | FUSED SILICA | 1.3 |
| 15 | −2.511 | 0.250 | | 2.2 |
| 16 | 17.165 | 2.500 | FUSED SILICA | 26.0 |
| 17 | 13.434 | 7.418 | | 22.5 |
| 18 | −281.019 | 3.829 | FUSED SILICA | 22.0 |
| 19 | −122.544 | −3.829 | MIRROR | 22.0 |
| 20 | −281.019 | −7.418 | | 22.0 |
| 21 | 13.434 | −2.500 | FUSED SILICA | 22.5 |
| 22 | 17.165 | 2.500 | MIRROR | 26.0 |
| 23 | 13.434 | 7.418 | | 22.5 |
| 24 | −281.019 | 3.829 | FUSED SILICA | 22.0 |
| 25 | −122.544 | 0.375 | | 22.0 |
| IMA | Infinity | | | 0.2 |

In this design, a 10 micron decenter, without compensators, introduces less than approximately 0.23 waves of aberration in all elements. The catadioptric group 413 is particularly insensitive with a 10 micron decenter of elements 407 and 408 introduces less than 0.15 waves of error. In the design presented in FIG. 3, average tolerance is approximately 0.15 waves of error at approximately 313 nm.

Figure 5:
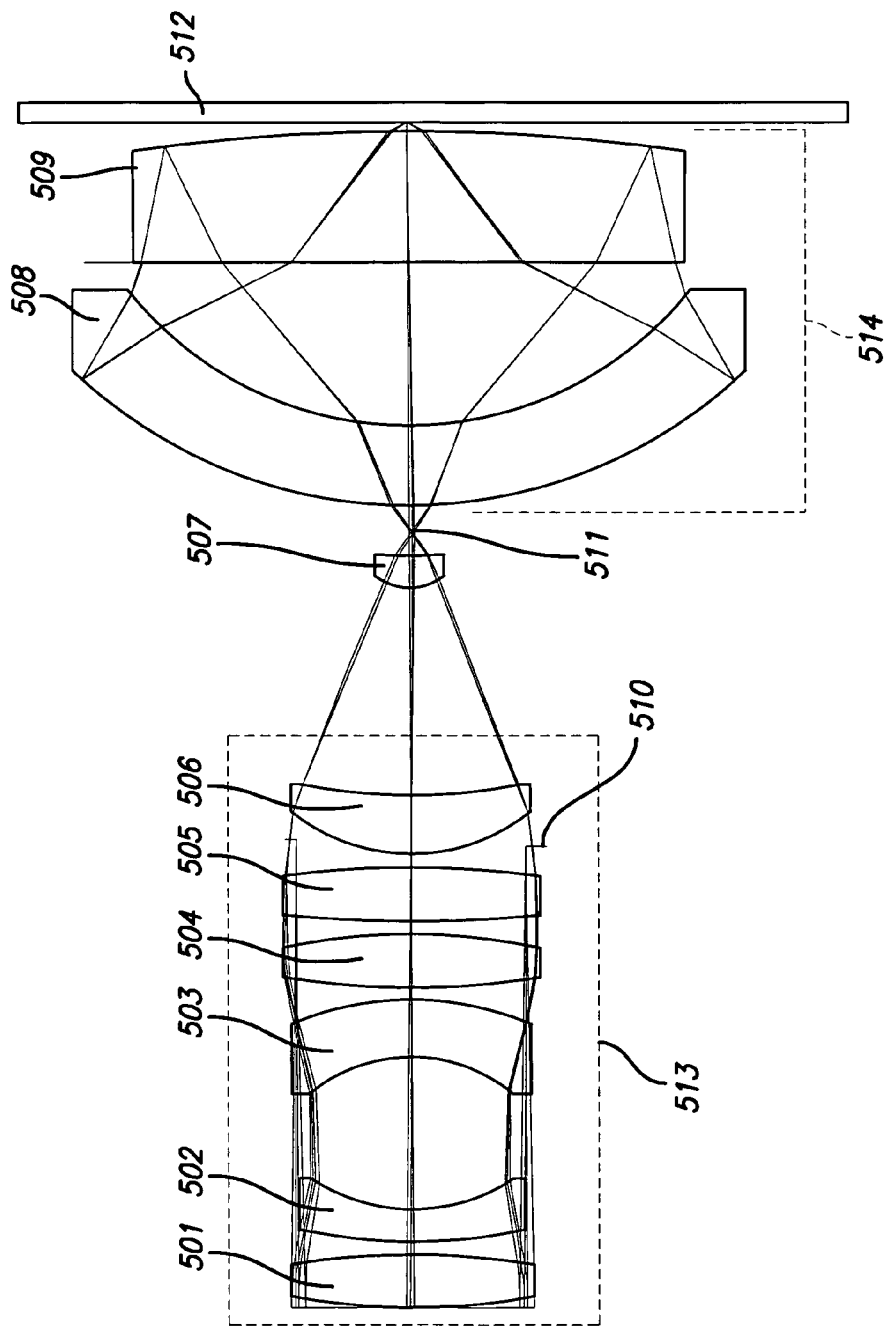
FIG. 5 presents a nine element reduced size catadioptric objective with a high NA in accordance with the present design, corrected over a bandwidth from 266 to 1000 nm and having a field size of approximately 0.150 mm.

An alternate aspect of the present design presents an objective with nine elements. This aspect of the design is presented in FIG. 5. The main difference between the design of FIG. 5 and that of FIG. 3 is the addition of two elements and reduced design tolerances. The objective of the design of FIG. 5 is corrected over a bandwidth from 266 to 1000 nm and has a field size of approximately 0.150 mm. The design of FIG. 5 maintains the high approximately 0.90 numerical aperture. The worst case polychromatic wavefront error for the FIG. 5 design is approximately 0.056 waves.

From FIG. 5, the catadioptric group 514 includes a Mangin mirror element 509, again a reflectively coated lens element, and a concave spherical reflector 508, which is also a reflectively coated lens element. Both Mangin mirror element 509 and concave spherical reflector 508 have central optical apertures where reflective material is absent. The absence of reflective material, in the center of the components shown, allows light to pass from the object or specimen 512 through Mangin mirror element 509, reflect from the second surface of concave spherical reflector 508 onto the Mangin mirror element 509, and transmit through concave spherical reflector 508 to form an intermediate image 511 after concave spherical reflector 508 and field lens group 507, comprising a single field lens in this aspect of the design.

The focusing lens group 513 employs multiple lens elements, in this aspect the six lens elements 501, 502, 503, 504,

505, and 506, which may all be formed from a single type of material. The focusing lens group 513 collects light from the field lens group 507, including the intermediate image 511. The entrance pupil 510 is the image of the internal pupil within the objective. An aperture or mask can be placed at this entrance pupil 510 to limit or modify the NA of the objective. The design presented in FIG. 5 has the advantages and flexibility described with respect to the design of FIG. 3. The lens prescription for this embodiment is shown in Table 3.

TABLE 3

Prescription for lenses for the design of FIG. 5

| Surf | Radius | Thickness | Glass | Diameter |
|---|---|---|---|---|
| OBJ | Infinity | Infinity | | 0.0 |
| 1 | Infinity | 17.404 | | 9.1 |
| STO | Infinity | −17.404 | | 8.5 |
| 3 | 22.472 | 2.000 | FUSED SILICA | 9.0 |
| 4 | −30.197 | 0.500 | | 8.9 |
| 5 | 18.198 | 1.250 | FUSED SILICA | 8.4 |
| 6 | 6.908 | 5.699 | | 7.6 |
| 7 | −6.044 | 2.144 | FUSED SILICA | 7.6 |
| 8 | −11.736 | 0.500 | | 8.9 |
| 9 | 29.226 | 2.000 | FUSED SILICA | 9.4 |
| 10 | −22.533 | 0.500 | | 9.6 |
| 11 | 54.321 | 2.000 | FUSED SILICA | 9.5 |
| 12 | −38.410 | 0.500 | | 9.4 |
| 13 | 6.850 | 2.250 | FUSED SILICA | 8.9 |
| 14 | 20.279 | 7.835 | | 8.2 |
| 15 | 2.040 | 1.249 | FUSED SILICA | 2.6 |
| 16 | 7.791 | 0.837 | | 1.7 |
| 17 | Infinity | 1.000 | | 0.6 |
| 18 | 17.766 | 3.020 | FUSED SILICA | 25.0 |
| 19 | 13.292 | 6.170 | | 21.0 |
| 20 | Infinity | 4.900 | FUSED SILICA | 20.5 |
| 21 | −76.135 | −4.900 | MIRROR | 20.5 |
| 22 | Infinity | −6.170 | | 20.5 |
| 23 | 13.292 | −3.020 | FUSED SILICA | 21.0 |
| 24 | 17.766 | 3.020 | MIRROR | 25.0 |
| 25 | 13.292 | 6.170 | | 21.0 |
| 26 | Infinity | 4.900 | FUSED SILICA | 20.5 |
| 27 | −76.135 | 0.300 | | 20.5 |
| IMA | Infinity | | | 0.2 |

For the objective of FIG. 5, a 10 micron decenter, without using any compensators, introduces less than approximately 0.25 waves of aberration in all elements. Average tolerance is approximately 0.13 waves of error at approximately 313 nm.

The present small catadioptric objective design approach allows for very wide corrected bandwidths using a single glass material and maintains smaller lens diameters than previously employed. Past designs have had field sizes of in the range of approximately 0.4 mm with relative bandwidths limited to a range of approximately 0.19 for a fully self corrected objective. These new designs have smaller field sizes of approximately 0.15 mm and larger relative bandwidths up to approximately 0.9 for a fully self corrected objective.

Figure 6:
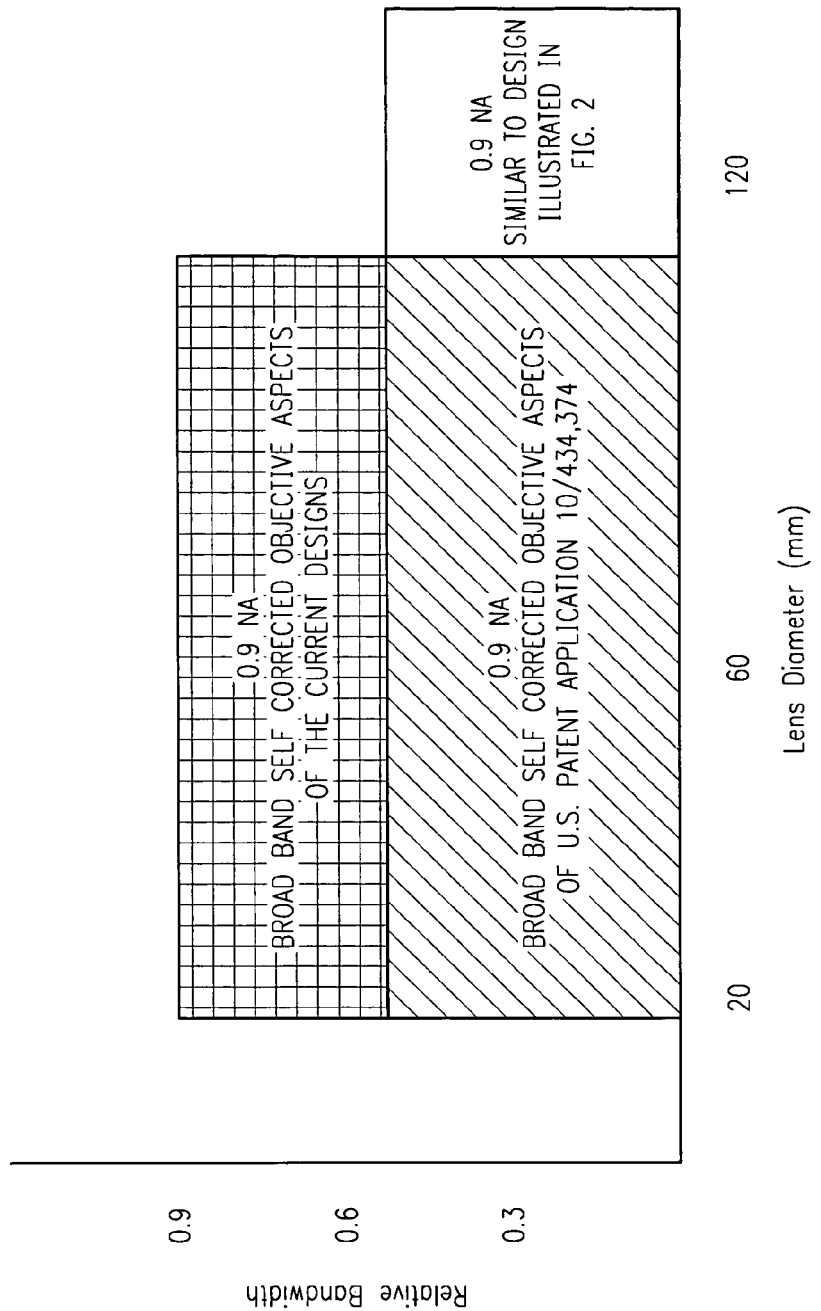
FIG. 6 is a graph of relative bandwidths supported by the present design.

Relative bandwidths supported by the designs in FIG. 3, FIG. 4, and FIG. 5 are shown FIG. 6. In this context, the relative bandwidth represents the ratio of the bandwidth divided by the central wavelength. The relatively large relative bandwidths available in the present design extend into the UV wavelengths below 400 nm. Generally, a higher relative bandwidth is preferred in many scenarios, as colors tend to appear more robust. In addition, relative bandwidth tends to decrease as central wavelength decreases due to the index of refraction for the material increasing in a nonlinear fashion. This phenomenon complicates producing an objective with a short central wavelength and a high relative bandwidth, in many cases making objective production virtually impossible. The higher performance and large relative bandwidths provided by the present design, as illustrated in FIG. 6 are highly desirable.

Figure 7:
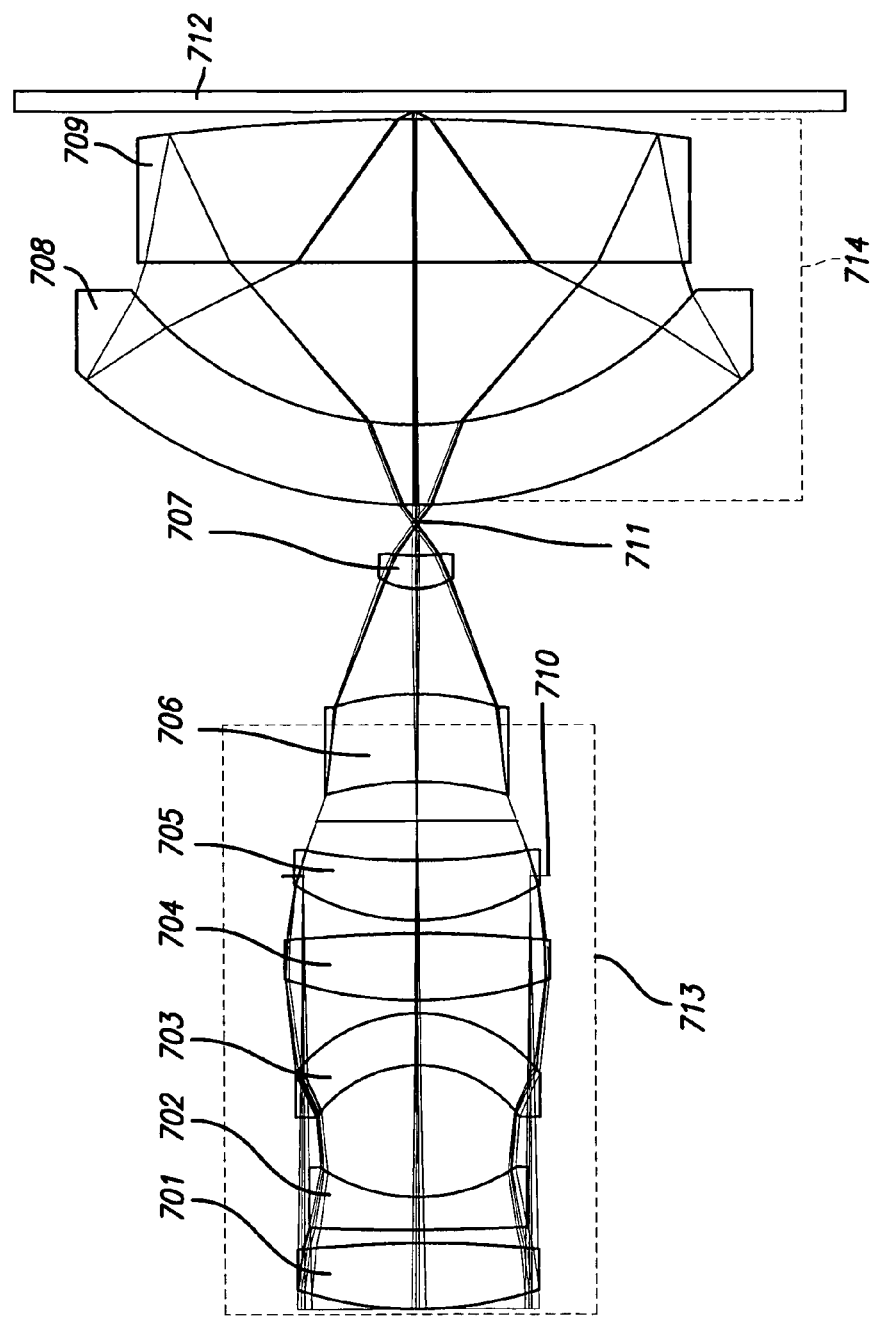
FIG. 7 shows an alternative nine element design optimized for a different central wavelength from that presented in FIG. 5.

Another aspect of the design presents an objective having nine elements. This aspect of the design is presented in FIG. 7. One difference between the design of FIG. 7 and that of FIG. 5 is optimization for a different central wavelength. The objective of the design of FIG. 7 is corrected over a bandwidth from 190 to 202 nm has a field size of approximately 0.150 mm. For this objective, relative bandwidth is approximately 0.06, a value much broader than typical catadioptric designs with a central wavelength of 196 nm. Previous designs have demonstrated relative bandwidths less than approximately 0.005 at 196 nm. The design of FIG. 7 again provides a relatively high approximately 0.90 numerical aperture. Worst case polychromatic wavefront error for the FIG. 7 design is approximately 0.045 waves.

From FIG. 7, the catadioptric group 714 includes a Mangin mirror element 709, which is a reflectively coated lens element, and a concave spherical reflector 708, which is also a reflectively coated lens element. Both Mangin mirror element 709 and concave spherical reflector 708 have central optical apertures where reflective material is absent. The absence of reflective material, in the center of these components allows light to pass from the object or specimen 712 through Mangin mirror element 709, reflect from the second surface of concave spherical reflector 708 onto the Mangin mirror element 709, and transmit through concave spherical reflector 708 to form an intermediate image 711 after concave spherical reflector 8 and field lens group 707. Field lens group 707 comprises a single field lens in this aspect of the design.

The focusing lens group 713 employs multiple lens elements, in this aspect the six lens elements 701, 702, 703, 704, 705, and 706, which may all be formed from a single type of material. The focusing lens group 713 collects light from the field lens group 707, including the intermediate image 711. The entrance pupil 710 is the image of the internal pupil within the objective. An aperture or mask can be placed at this entrance pupil 710 to limit or modify the NA of the objective.

The lens prescription for this embodiment is shown in Table 4.

TABLE 4

Prescription for lenses for the design of FIG. 7

| Surf | Radius | Thickness | Glass | Diameter |
|---|---|---|---|---|
| OBJ | Infinity | Infinity | | 0.0 |
| 1 | Infinity | 16.374 | | 9.0 |
| STO | Infinity | −16.374 | | 8.5 |
| 3 | 13.996 | 2.500 | FUSED SILICA | 9.0 |
| 4 | −44.912 | 0.500 | | 8.6 |
| 5 | 70.761 | 1.250 | FUSED SILICA | 8.2 |
| 6 | 6.483 | 4.999 | | 7.3 |
| 7 | −4.675 | 1.964 | FUSED SILICA | 7.6 |
| 8 | −5.735 | 0.500 | | 9.1 |
| 9 | 15.538 | 2.500 | FUSED SILICA | 9.9 |
| 10 | −48.225 | 0.500 | | 9.7 |
| 11 | 8.447 | 2.250 | FUSED SILICA | 9.2 |
| 12 | 22.024 | 1.498 | | 8.4 |
| 13 | Infinity | 1.500 | | 7.6 |
| 14 | −12.098 | 3.323 | FUSED SILICA | 6.9 |
| 15 | −10.131 | 3.985 | | 6.2 |
| 16 | 2.582 | 1.250 | FUSED SILICA | 2.8 |
| 17 | 11.533 | 1.216 | | 2.0 |
| 18 | Infinity | 0.699 | | 0.4 |
| 19 | 17.897 | 3.038 | FUSED SILICA | 25.0 |
| 20 | 13.385 | 6.122 | | 21.0 |
| 21 | Infinity | 5.409 | FUSED SILICA | 20.5 |
| 22 | −73.634 | −5.409 | MIRROR | 20.5 |

TABLE 4-continued

Prescription for lenses for the design of FIG. 7

| Surf | Radius | Thickness | Glass | Diameter |
|---|---|---|---|---|
| 23 | Infinity | −6.122 | | 20.5 |
| 24 | 13.385 | −3.038 | FUSED SILICA | 21.0 |
| 25 | 17.897 | 3.038 | MIRROR | 25.0 |
| 26 | 13.385 | 6.122 | | 21.0 |
| 27 | Infinity | 5.409 | FUSED SILICA | 20.5 |
| 28 | −73.634 | 0.300 | | 20.5 |
| IMA | Infinity | | | 0.2 |

Another aspect of the present design includes an objective capable of immersion imaging. Immersion is used for achieving high NAs for increased resolution. Placed a fluid between the sample or specimen and the objective provides a design having increased NA. If the space between the sample and the objective has an oil with an index of 1.5 and a 64 degree marginal ray angle, the resultant NA will be approximately 1.35.

Employing immersion in the design of FIG. 3 entails placing fluid between the Mangin element 307, which has two surfaces with flat to mild curvatures and specimen 310 so that the NA is greater than one in that region. Any light reaching the second surface or rightmost surface of Mangin element 307 with an angle of greater than 41 degrees will be totally internally reflected.

Figure 8:
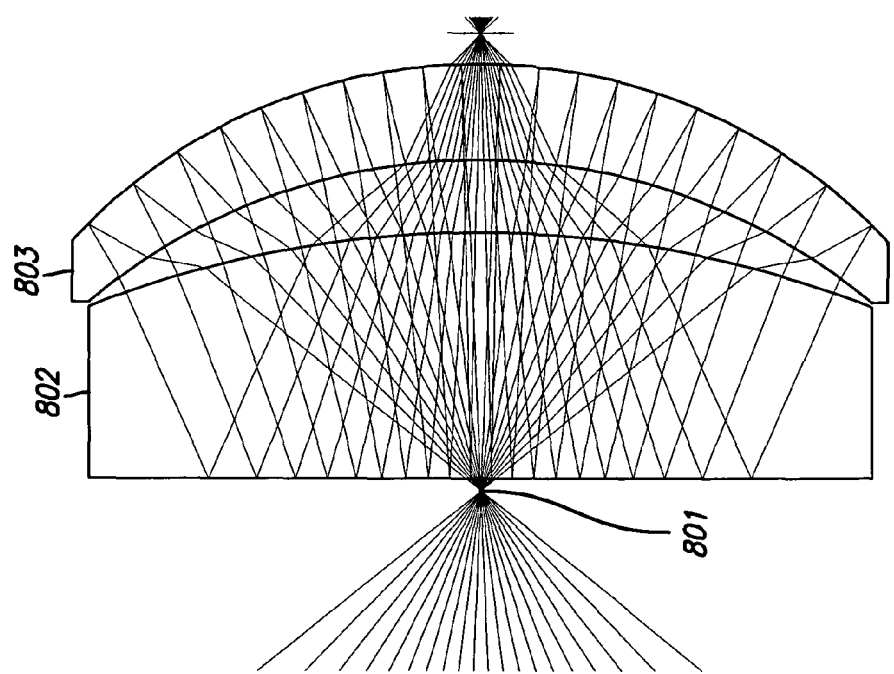
FIG. 8 presents a different catadioptric group or Mangin mirror arrangement for use of an objective in the presence of an immersion substance, such as water, oil, or a silicone gel.

The design of FIG. 8 addresses the immersion in the presence of curved elements issue by increasing the curvature of the second surface of the Mangin element 802 nearest the specimen 801. The revised thicknesses and curvatures of elements 802 and 803 provide a Mangin mirror arrangement or catadioptric group having the ability to operate in the presence of immersion. The design of the catadioptric group corrects spherical aberration along with axial color and the chromatic variation of spherical aberration. Deviations from this catadioptric form can produce compensating aberrations for any subsequent or following refractive elements.

Figure 9:
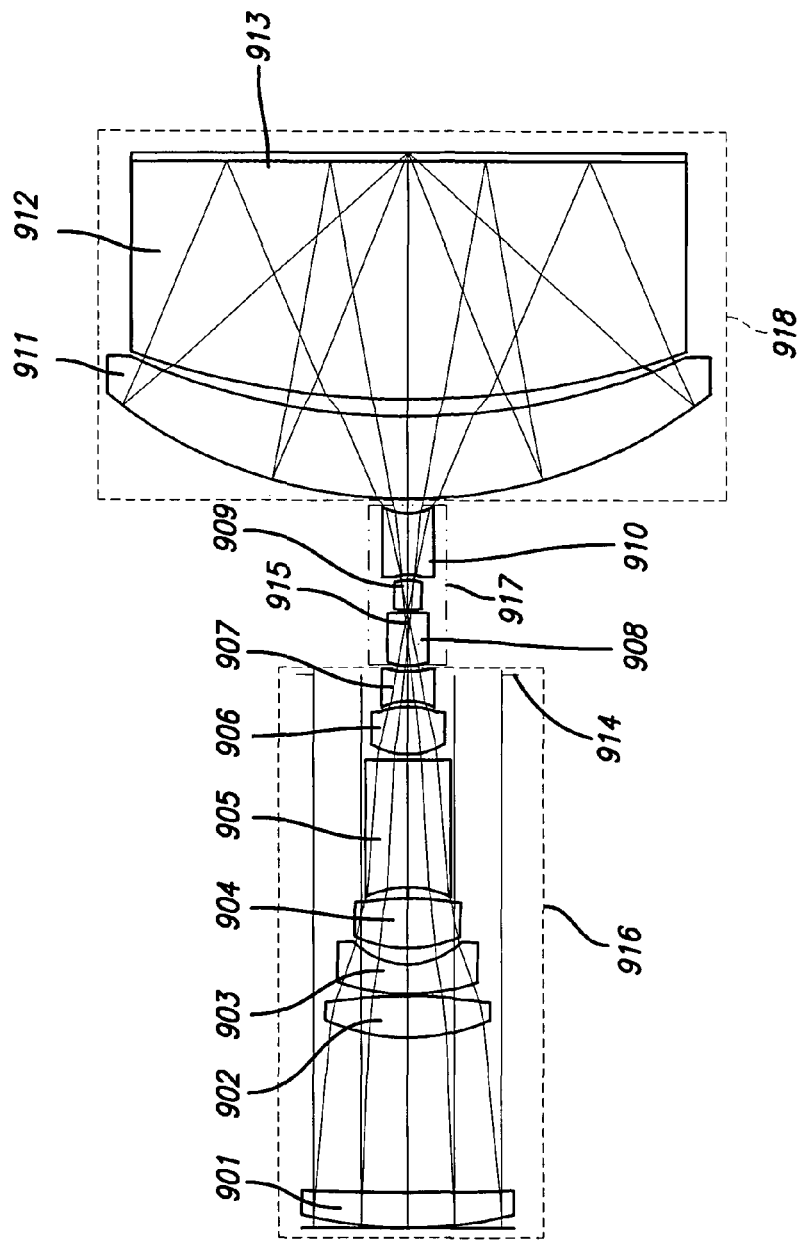
FIG. 9 illustrates a catadioptric objective design including an immersion fluid.

One such immersion design based on this catadioptric design is shown in FIG. 9. The objective of the design of FIG. 9 is corrected over a bandwidth from approximately 266 to 436 nm and has a field size of approximately 0.150 mm. The design of FIG. 9 maintains the relatively high approximately 1.1 numerical aperture. The worst case polychromatic wavefront error for the FIG. 9 design is approximately 0.057 waves.

From FIG. 9, the catadioptric group 918 includes a Mangin mirror element 912, which is a reflectively coated lens element, and a concave spherical reflector 911, which is also a reflectively coated lens element. Both Mangin mirror element 912 and concave spherical reflector 911 have central optical apertures where reflective material is absent. The absence of reflective material from the center of the components shown allows light to pass from the object or specimen 913 through Mangin mirror element 912, reflect from the second surface of concave spherical reflector 911 onto the Mangin mirror element 912, and transmit through concave spherical reflector 911 to form an intermediate image 915 after passing concave spherical reflector 911 and field lens group 917, comprising lenses 908, 909, and 910 in this aspect of the design.

The focusing lens group 916 employs multiple lens elements, in this aspect the seven lens elements 901, 902, 903, 904, 905, 906, and 907. The focusing lens group 916 collects light from the field lens group 917, including the intermediate image 915. The entrance pupil 914 is the image of the internal pupil within the objective. Again, an aperture or mask can be placed at this entrance pupil 914 to limit or modify the NA of the objective. The lens prescription for the design of FIG. 12 is shown in Table 5.

TABLE 5

Figure 12:
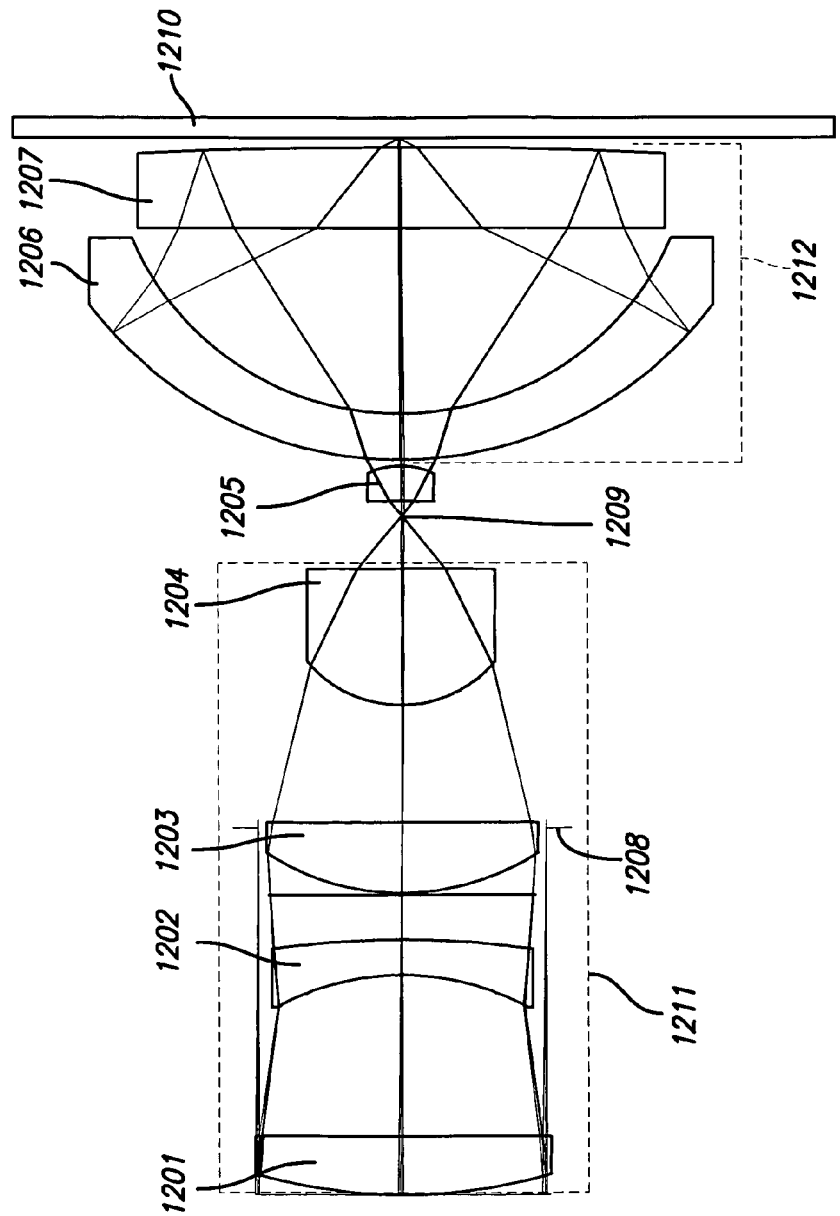
FIG. 12 is an objective having seven elements corrected over a wavelength range from 320-1300 nm using a single glass material, or in certain circumstances, more than one glass material to improve performance.

Prescription for lenses for the design of FIG. 12

| Surf | Radius | Thickness | Glass | Diameter |
|---|---|---|---|---|
| OBJ | Infinity | Infinity | | 0.0 |
| 1 | Infinity | 23.363 | | 8.8 |
| STO | Infinity | −23.363 | | 7.8 |
| 3 | 17.529 | 1.500 | CALCIUM FLUORIDE | 8.8 |
| 4 | 123.317 | 6.560 | | 8.6 |
| 5 | 8.254 | 1.750 | CALCIUM FLUORIDE | 6.9 |
| 6 | −21.949 | 0.099 | | 6.5 |
| 7 | 8.712 | 1.250 | FUSED SILICA | 5.8 |
| 8 | 3.105 | 0.684 | | 4.5 |
| 9 | 5.063 | 2.089 | CALCIUM FLUORIDE | 4.4 |
| 10 | −11.418 | 0.470 | | 3.7 |
| 11 | −4.096 | 5.352 | FUSED SILICA | 3.6 |
| 12 | 93.921 | 0.250 | | 3.2 |
| 13 | 2.946 | 2.000 | CALCIUM FLUORIDE | 3.1 |
| 14 | −3.475 | 0.249 | | 2.5 |
| 15 | −2.433 | 1.250 | FUSED SILICA | 2.3 |
| 16 | 3.487 | 0.231 | | 1.8 |
| 17 | 2.262 | 2.250 | CALCIUM FLUORIDE | 1.8 |
| 18 | −5.028 | 0.110 | | 1.0 |
| 19 | 2.727 | 1.250 | CALCIUM FLUORIDE | 0.9 |
| 20 | −1.967 | 0.243 | | 1.1 |
| 21 | −1.513 | 2.577 | FUSED SILICA | 1.2 |
| 22 | 2.241 | 0.608 | | 2.1 |
| 23 | 19.760 | 3.499 | FUSED SILICA | 25.0 |
| 24 | 27.518 | 0.717 | | 23.0 |
| 25 | 33.723 | 10.010 | FUSED SILICA | 23.0 |
| 26 | Infinity | −10.010 | MIRROR | 23.0 |
| 27 | 33.723 | −0.717 | | 23.0 |
| 28 | 27.518 | −3.499 | FUSED SILICA | 23.0 |
| 29 | 19.760 | 3.499 | MIRROR | 25.0 |
| 30 | 27.518 | 0.717 | | 23.0 |
| 31 | 33.723 | 10.010 | FUSED SILICA | 23.0 |
| 32 | Infinity | 0.375 | IMMERSION FLUID | 23.0 |
| IMA | Infinity | | | 0.2 |

Figure 10:
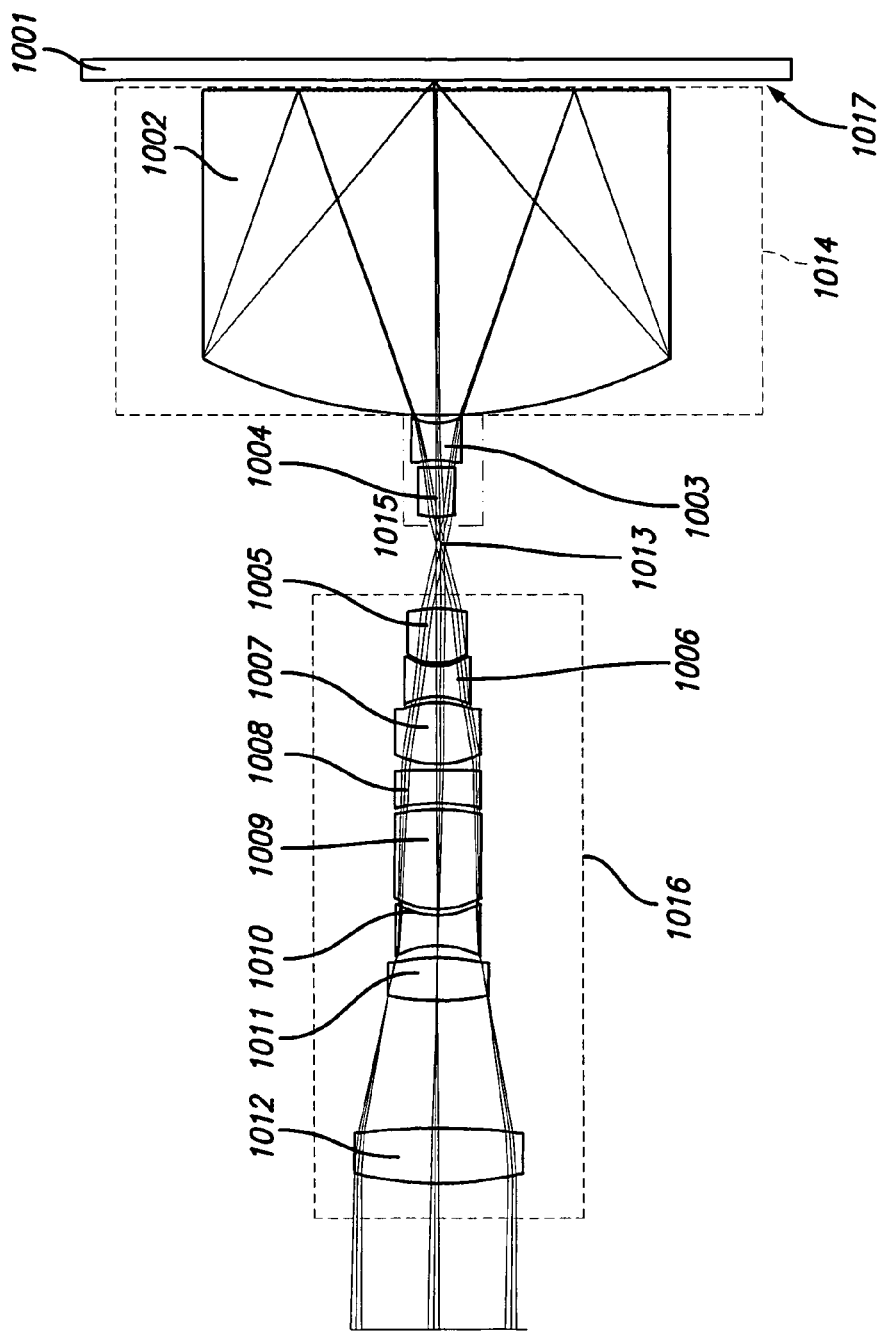
FIG. 10 is a catadioptric objective design including an immersion fluid wherein the catadioptric group is fashioned from a single, solid element.

An additional aspect of the present design uses a different approach to address the immersion issue with a similar catadioptric objective design. The catadioptric group may be fashioned from a single, solid element. A design based on this type of catadioptric group is shown in FIG. 10. The objective of the design of FIG. 10 is corrected over a bandwidth from 266 to 436 nm and has a field size of 0.150 mm. The design of FIG. 10 maintains the high approximately 0.95 numerical aperture. A worst case polychromatic wavefront error for the FIG. 10 design is approximately 0.037 waves.

From FIG. 10, the catadioptric group 1014 includes a single Mangin mirror element 1002, which is reflectively coated on both sides. Both sides of Mangin mirror element 1002 have central optical apertures where reflective material is absent. Again, as with previous design aspects, the absence of reflective material from the center of the components shown allows light to pass from the object or specimen 1001 through the first surface of Mangin mirror element 1002, reflect from the second surface of element 1002 transmit to the first surface of Mangin mirror element 1002. Light energy then reflects from the first surface of element 1002 and passes through the second surface of element 1002 to form an intermediate image 1013 after passing field lens group 1015, comprising lenses 1003 and 1004 in this aspect of the design.

From FIG. 10, the space between specimen 1001 and Mangin mirror element 1002 is filled by the immersion substance or immersion fluid. Hence the space between specimen 1001 and Mangin mirror element 1002 in this view is filled with the immersion substance or immersion fluid 1017, or the substance or fluid may be omitted if desired. Immersion fluid is therefore typically in direct contact with element 1002. Element 1002 may have a reflective coating on the right hand side with a small aperture in the center to allow light to pass through to the immersion fluid and to the specimen. In normal operation, a small amount of immersion substance, such as a drop of immersion fluid, is placed on the object to be imaged, such as specimen 1001. The system brings the objective into relatively close proximity with the specimen 1001. When the objective touches the immersion fluid, the immersion fluid expands to fill the gap between element 1002 and the specimen 1001.

The focusing lens group 1016 employs multiple lens elements, in this aspect the eight lens elements 1005, 1006, 1007, 1008, 1009, 1010, 1011, and 1012. The focusing lens group 1016 collects light from the field lens group 1015, including the intermediate image 1003.

The lens prescription for the design of FIG. 10 is shown in Table 6.

TABLE 6

Prescription for lenses for the design of FIG. 10

| Surf | Radius | Thickness | Glass | Diameter |
|---|---|---|---|---|
| OBJ | Infinity | 0.375 | IMMERSION FLUID | 0.0 |
| 1 | Infinity | 13.250 | FUSED SILICA | 18.0 |
| STO | −18.906 | −13.250 | MIRROR | 18.0 |
| 3 | Infinity | 13.250 | MIRROR | 18.0 |
| 4 | −18.906 | 0.313 | | 18.0 |
| 5 | −2.281 | 1.514 | FUSED SILICA | 1.7 |
| 6 | 2.442 | 0.292 | | 1.2 |
| 7 | 18.937 | 2.015 | CALCIUM FLUORIDE | 1.1 |
| 8 | −2.371 | 3.750 | | 0.8 |
| 9 | 3.981 | 2.250 | CALCIUM FLUORIDE | 1.3 |
| 10 | −2.017 | 0.125 | | 1.7 |
| 11 | −1.975 | 1.250 | FUSED SILICA | 1.7 |
| 12 | 2.762 | 0.250 | | 2.0 |
| 13 | 3.800 | 2.500 | CALCIUM FLUORIDE | 2.2 |
| 14 | −3.788 | 0.250 | | 2.8 |
| 15 | 27.780 | 1.356 | FUSED SILICA | 2.8 |
| 16 | 7.300 | 0.250 | | 2.9 |
| 17 | 7.757 | 4.063 | CALCIUM FLUORIDE | 2.9 |
| 18 | −3.391 | 0.250 | | 3.1 |
| 19 | −3.101 | 1.250 | FUSED SILICA | 3.0 |
| 20 | 3.484 | 0.500 | | 3.2 |
| 21 | 7.930 | 1.750 | CALCIUM FLUORIDE | 3.4 |
| 22 | −9.660 | 5.199 | | 3.8 |
| 23 | 24.789 | 2.250 | CALCIUM FLUORIDE | 5.7 |
| 24 | −13.120 | 5.000 | | 6.0 |
| 25 | — | 11.336 | | 6.0 |
| IMA | Infinity | | | 0.9 |

Figure 11:
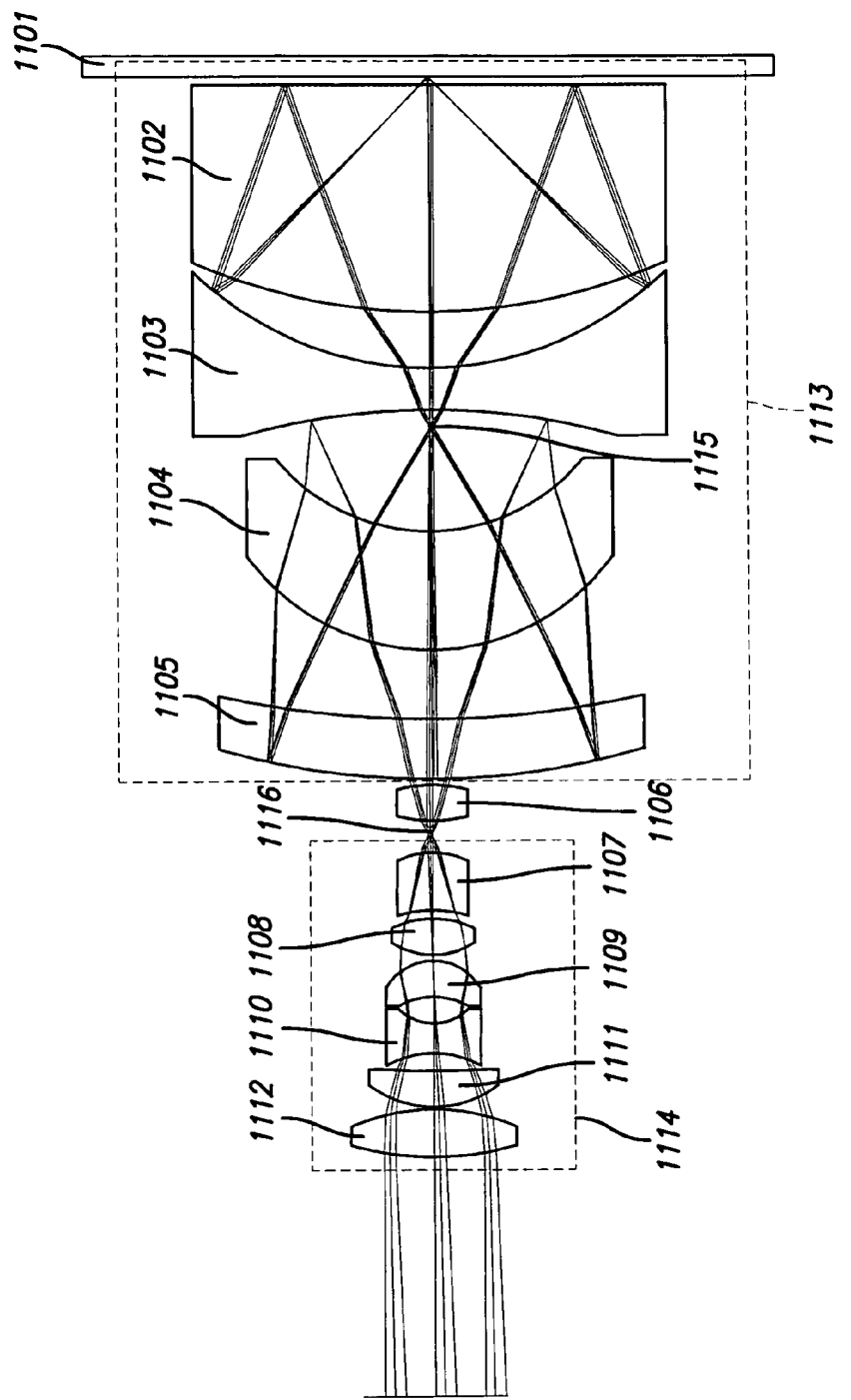
FIG. 11 shows a catadioptric objective design including an immersion fluid wherein the catadioptric group includes two sets of lens mirror cavities.

Another approach to operating in the presence of immersion fluid operates with the catadioptric group including two sets of lens mirror cavities. A design based on this type of catadioptric group is shown in FIG. 11. The objective of the design of FIG. 11 is corrected over a bandwidth from 266 to 320 nm has a field size of 0.150 mm. The design of FIG. 11 maintains the high approximately 1.15 numerical aperture. Worst case polychromatic wavefront error for the FIG. 11 design is approximately 0.052 waves.

From FIG. 11, the catadioptric group 1113 includes a first Mangin mirror element 1102, reflectively coated on one side, mirror 1103, reflectively coated on both sides, lens 1104, and second Mangin mirror element 1105, reflectively coated on the second side, or outer left hand side in the orientation shown. The front side of first Mangin mirror element 1102, both sides of mirror 1103, and the second side of second Mangin mirror element 1105 have central optical apertures where reflective material is absent. The absence of reflective material, in the center of the components shown, allows light to pass from the object or specimen 1101 through the first surface of first Mangin mirror element 1102, reflect from the first surface of element 1103 transmit to the first surface of first Mangin mirror element 1102, reflect from the first surface of first Mangin mirror element 1102 and transmit through the second surface of element 1103 to form a first intermediate image 1115. Light then passes through lens element 1104 and reflects off the second surface of second Mangin element 1105 before returning through lens 1104, reflecting off the second surface of mirror 1103, and forming second intermediate image 1116 after passing lens 1104, second Mangin element 1105, and field lens group comprising a single lens 1106 in this aspect of the design.

The space between specimen 1101 and first Mangin mirror element 1102 is filled by the immersion substance or immersion fluid. Immersion fluid is therefore typically in direct contact with element 1102. First Mangin mirror element 1102 may have a reflective coating on the right hand side with a small aperture in the center to allow light to pass through to the immersion fluid and to the specimen 1101. In normal operation, a small amount of immersion substance, such as a drop of immersion fluid, is placed on the object to be imaged, such as specimen 1101. The system brings the objective into relatively close proximity with the specimen 1101. When the objective touches the immersion fluid, the immersion fluid expands to fill the gap between first Mangin mirror element 1102 and the specimen 1001.

The focusing lens group 1114 employs multiple lens elements, in this aspect the six lens elements 1007, 1008, 1109, 1110, 1111, and 1112. The focusing lens group 1114 collects light from the field lens group 1106, including the intermediate image 1116.

The lens prescription for the design of FIG. 11 is shown in Table 7.

TABLE 7

Prescription for lenses for the design of FIG. 11

| Surf | Radius | Thickness | Glass | Diameter |
|---|---|---|---|---|
| OBJ | Infinity | 1.000 | IMMERSION FLUID | 0.030165 |
| 1 | Infinity | −0.675 | IMMERSION FLUID | 20 |
| 2 | Infinity | 9.443 | FUSED SILICA | 20 |
| 3 | −25.125 | 2.328 | | 20 |
| 4 | −14.436 | −2.328 | MIRROR | 20 |
| 5 | −25.125 | −9.443 | FUSED SILICA | 20 |
| 6 | Infinity | 9.443 | MIRROR | 20 |
| 7 | −25.125 | 2.328 | | 20 |
| 8 | −14.427 | 1.750 | FUSED SILICA | 20 |
| 9 | 29.875 | 5.071 | | 16 |
| 10 | −8.482 | 4.931 | FUSED SILICA | 13 |
| 11 | −9.652 | 2.877 | | 16 |
| 12 | −41.988 | 2.500 | FUSED SILICA | 16 |
| 13 | −32.709 | −2.500 | MIRROR | 16 |
| 14 | −41.988 | −2.877 | | 16 |
| 15 | −9.652 | −4.931 | FUSED SILICA | 16 |
| 16 | −8.482 | −5.071 | | 13 |
| STO | 29.875 | 5.071 | MIRROR | 13 |
| 18 | −8.482 | 4.931 | FUSED SILICA | 13 |
| 19 | −9.652 | 2.877 | | 16 |
| 20 | −41.988 | 2.500 | FUSED SILICA | 16 |
| 21 | −32.709 | 0.250 | | 16 |
| 22 | 5.939 | 1.500 | FUSED SILICA | 3 |
| 23 | −5.557 | 1.332 | | 3 |
| 24 | 3.374 | 2.422 | FUSED SILICA | 3 |
| 25 | 5.773 | 0.336 | | 3 |
| 26 | 4.071 | 1.500 | FUSED SILICA | 3.5 |
| 27 | −3.249 | 0.250 | | 3.5 |
| 28 | 2.358 | 1.500 | FUSED SILICA | 4 |
| 29 | 3.166 | 1.092 | | 3 |
| 30 | −2.132 | 1.250 | FUSED SILICA | 3 |
| 31 | 4.177 | 0.746 | | 4 |

TABLE 7-continued

Prescription for lenses for the design of FIG. 11

| Surf | Radius | Thickness | Glass | Diameter |
|---|---|---|---|---|
| 32 | −32.009 | 1.500 | FUSED SILICA | 4.5 |
| 33 | −4.559 | 0.100 | | 5.5 |
| 34 | 8.802 | 2.000 | FUSED SILICA | 7 |
| 35 | −12.695 | 4.750 | | 7 |
| 36 | — | 10.000 | | 4.942964 |
| IMA | Infinity | | | 0.166772 |

An alternate aspect of the present design presents an objective having seven elements corrected over a wavelength range from 320-1300 nm using a single glass material, or in certain circumstances, more than one glass material to improve performance. One aspect of such an objective design is shown in FIG. 12. The catadioptric objective as shown in FIG. 12 is optimized for broad-band imaging in the UV through the infrared spectral region, namely approximately 0.320 to 1.3 micron wavelengths.

FIG. 12, the catadioptric group 1212 or Mangin mirror arrangement includes a Mangin mirror element 1207. Mangin mirror element 1207 is a reflectively coated lens element. The catadioptric group 1212 also includes and a concave spherical reflector 1206, also a reflectively coated lens element. Both elements in the catadioptric group 1212 have a central optical apertures where reflective material is absent. This allows light to pass from the object or specimen 1210 through Mangin mirror element 1207, reflect from the second or inner surface of concave spherical reflector 1206, onto the reflective surface of Mangin mirror element 1207, and through concave spherical reflector 1206 to form an intermediate image 1209 after concave spherical reflector 1206 and field lens group 1205. The field lens group 1205 may comprise one or more lenses, and in the aspect shown in FIG. 12, one field lens is employed in the field lens group 1205.

The focusing lens group 1211 uses multiple lens elements, in the aspect shown four lens elements 1201, 1202, 1203, and 1204. All lenses in the focusing lens group 311 may be formed from a single type of material to collect the light from the field lens group 1205 and the intermediate image 1209. The entrance pupil 1208 is the image of the internal pupil within the objective. An aperture or mask can be placed at this entrance pupil 1208 to limit or modify the NA of the objective.

The lens prescription for the aspect of the invention illustrated in FIG. 12 is presented in Table 8.

TABLE 8

Prescription for lenses for the design of FIG. 12

| Surf | Radius | Thickness | Glass | Diameter |
|---|---|---|---|---|
| OBJ | Infinity | Infinity | | 0.0 |
| 1 | Infinity | 15.612 | | 12.4 |
| STO | Infinity | −15.612 | | 12.0 |
| 3 | 21.987 | 2.500 | FUSED SILICA | 12.3 |
| 4 | Infinity | 6.866 | | 12.0 |
| 5 | −10.614 | 1.500 | FUSED SILICA | 10.5 |
| 6 | −37.828 | 1.900 | | 10.9 |
| 7 | Infinity | 0.100 | | 11.1 |
| 8 | 10.233 | 3.000 | FUSED SILICA | 11.3 |
| 9 | Infinity | 4.985 | | 10.9 |
| 10 | 5.054 | 5.802 | FUSED SILICA | 7.8 |
| 11 | Infinity | 2.914 | | 4.1 |
| 12 | −7.057 | 1.500 | FUSED SILICA | 1.5 |
| 13 | −2.981 | 0.250 | | 2.7 |
| 14 | 16.091 | 1.967 | FUSED SILICA | 26.0 |

TABLE 8-continued

Prescription for lenses for the design of FIG. 12

| Surf | Radius | Thickness | Glass | Diameter |
|---|---|---|---|---|
| 15 | 12.205 | 7.862 | | 22.5 |
| 16 | Infinity | 3.479 | FUSED SILICA | 22.0 |
| 17 | −231.641 | −3.479 | MIRROR | 22.0 |
| 18 | Infinity | −7.862 | | 22.0 |
| 19 | 12.205 | −1.967 | FUSED SILICA | 22.5 |
| 20 | 16.091 | 1.967 | MIRROR | 26.0 |
| 21 | 12.205 | 7.862 | | 22.5 |
| 22 | Infinity | 3.479 | FUSED SILICA | 22.0 |
| 23 | −231.641 | 0.375 | | 22.0 |
| IMA | Infinity | | | 0.2 |

In the design presented in FIG. 12, the numerical aperture may approach or even exceed approximately 0.90. The design presented herein, including the aspect illustrated in FIG. 12, provides a maximum numerical aperture in all cases in excess of 0.65.

From FIG. 12, the focusing lens group 1211 has the ability to receive light energy and transmit focused light energy. The field lens group 1205 has the ability to receive the focused light energy and provide intermediate light energy, and form intermediate image 1209. The catadioptric group or Mangin mirror arrangement 1212 receives the intermediate energy and provides controlled light energy to the specimen. Alternately, the reflected path originates at the specimen, and light reflected from the specimen is received by the catadioptric group or Mangin mirror arrangement 1212 and forms and transmits reflected light energy. The field lens group 1205 receives the reflected light energy and transmitting resultant light energy, and the focusing lens group receives resultant light energy and transmits focused resultant light energy.

The present system design may be employed in various environments, including but not limited to lithography, microscopy, biological inspection, medical research, and the like.

The design presented herein and the specific aspects illustrated are meant not to be limiting, but may include alternate components while still incorporating the teachings and benefits of the invention, namely the small design having a high NA able to be employed in various wavelengths using different illumination modes. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An objective comprising:
    a focusing lens group comprising at least one focusing lens, each focusing lens having diameter less than approximately 100 millimeters, the focusing lens group configured to receive light energy and transmitting focused light energy;

a field lens group comprising at least one field lens, each field lens having diameter less than approximately 100 millimeters and configured to receive said focused light energy and transmit intermediate light energy; and a Mangin mirror group comprising at least one Mangin mirror element having a flat surface, each Mangin mirror element having diameter less than 100 millimeters and configured to receive said intermediate light energy and provide controlled light energy through an immersion substance to a specimen, said Mangin mirror group positioned between the field lens group and the specimen, wherein the flat surface of at least one Mangin mirror element is proximate the immersion substance and at least one Mangin mirror element in the Mangin mirror group comprises two reflective surfaces;

wherein each focusing lens and each field lens is formed from a single glass material, and further wherein every component of said Mangin mirror group, said field lens group and said focusing lens group is aligned along a received light energy axis, and further wherein the two reflective surfaces of the at least one Mangin mirror element in the Mangin mirror group are mirrored surfaces separated by a nonzero distance along the received light energy axis.

2. The objective of claim 1, wherein said objective has a field size of approximately 0.15 mm.

3. The objective of claim 1, configured to have a numerical aperture of approximately 1.2.

4. The objective of claim 1, wherein each lens used in the objective has a diameter of less than approximately 25 millimeters.

5. The objective of claim 1, said objective used with a microscope having a flange, wherein the flange may be located at least approximately 45 millimeters from the specimen during normal operation.

6. The objective of claim 5, wherein the flange may be located at least approximately 100 millimeters from the specimen during normal operation.

7. The objective of claim 1, further comprising at least one additional lens constructed from a second glass material.

8. The objective of claim 1, wherein the immersion substance is water.

9. The objective of claim 1, wherein the immersion substance is oil.

10. The objective of claim 1, wherein the immersion substance is silicone gel.

11. The objective of claim 1, wherein the objective is optimized to produce minimum spherical aberration, axial color, and chromatic variation of aberrations.

12. The objective of claim 1, wherein the at least one mangin mirror element is optimized to produce spherical, axial color, and chromatic variation of aberrations to compensate for aberrations induced by the focusing lens group.

13. An objective comprising:
a focusing lens group comprising at least one focusing lens, each focusing lens having diameter less than approximately 100 millimeters, said focusing lens group configured to receive light energy and transmit focused light energy;

a field lens group comprising at least one field lens, each field lens having diameter less than approximately 100 millimeters, said field lens group configured to receive said focused light energy and transmit intermediate light energy; and a Mangin mirror group comprising at least one Mangin mirror element having a flat surface, each Mangin mirror element having diameter less than 100 millimeters, said Mangin mirror group configured to receive said intermediate light energy and provide controlled light energy through an immersion substance to a specimen, said Mangin mirror group positioned between the field lens group and the specimen and said Mangin mirror element flat surface contacting the immersion substance and at least one Mangin mirror element in the Mangin mirror group comprises two reflective surfaces;

wherein said objective is configured to provide imaging while receiving light energy at wavelengths less than 400 nm and further wherein every component of said Mangin mirror group, said field lens group, and said focusing lens group is aligned along a single received light energy axis and further wherein the two reflective surfaces of the at least one Mangin mirror element in the Mangin mirror group are mirrored surfaces separated by a nonzero distance along the received light energy axis.

14. The objective of claim 13, wherein said objective has a field size of approximately 0.15 mm.

15. The objective of claim 13, wherein said Mangin mirror group comprises:
a single lens/mirror element comprising:
a substantially curved concave surface; and
a second minimally curved surface;
wherein both surfaces of the single lens/mirror element are reflective with small central apertures through which light energy may pass.

16. The objective of claim 13, said objective having a numerical aperture of greater than approximately 1.0 at the specimen.

17. The objective of claim 13, wherein each lens in the objective has a diameter of less than approximately 25 millimeters.

18. The objective of claim 13, said objective having an ability to be employed with a microscope having a flange, wherein the flange may be located less than no more than approximately 45 millimeters from the specimen during normal operation.

19. The objective of claim 13, wherein the lenses of the objective are constructed of no more than two glass materials.

20. The objective of claim 19, wherein the no more than two glass materials comprise fused silica and calcium fluoride.

21. The objective of claim 13, wherein the immersion substance comprises one from a group comprising water, oil, and silicone gel.

22. The objective of claim 13, configured to have a numerical aperture of approximately 1.2.

23. A method for inspecting a specimen, comprising:
providing light energy having a wavelength in the range of approximately 157 nanometers through the infrared light range;

focusing said light energy using a focusing lens group comprising at least one lens into focused light energy, where each lens in said focusing lens group has diameter less than approximately 100 millimeters;

receiving said focused light energy and converting said focused light energy into intermediate light energy using a field lens group; and receiving said intermediate light energy through a Mangin mirror group and providing controlled light energy from the Mangin mirror group through an immersion substance to a specimen, said Mangin mirror group comprising one element having a flat surface positioned adjacent the immersion substance, said Mangin mirror group positioned between the field lens group and the specimen, wherein at least one element in the Mangin mirror group comprises two reflective surfaces;

wherein every component of said Mangin mirror group, field lens group, and focusing lens group is aligned along a single received light energy axis and further wherein the two reflective surfaces of the at least one element in the Mangin mirror group are mirrored surfaces separated by a nonzero distance along the received light energy axis.

24. The method of claim 23, wherein said method results in a field size of approximately 0.15 mm.

25. The method of claim 24, wherein said providing, focusing, focused light energy receiving, and intermediate light energy receiving results in a field size of approximately 0.15 mm.

26. The method of claim 24, providing, focusing, focused light energy receiving, and intermediate light energy receiving results in a numerical aperture of approximately 1.2.

27. The method of claim 24, wherein each lens used has a diameter of less than approximately 25 millimeters.

28. The method of claim 24, said method employed with a microscope having a flange, wherein the flange may be located at least approximately 45 millimeters from the specimen during normal operation.

29. The method of claim 28, wherein the flange may be located at least approximately 100 millimeters from the specimen during normal operation.

30. The method of claim 24, wherein only two glass materials are used for lenses.

31. The method of claim 24, wherein the immersion substance is water.

32. The method of claim 24, wherein the immersion substance is oil.

33. The method of claim 24, wherein the immersion substance is silicone gel.

34. The method of claim 24, wherein providing, focusing, focused light energy receiving, and intermediate light energy receiving is optimized to produce minimum spherical aberration, axial color, and chromatic variation of aberrations.

35. The method of claim 24, wherein the providing, focusing, focused light energy receiving, and intermediate light energy receiving is optimized to produce spherical, axial color, and chromatic variation of aberrations to compensate for aberrations induced.

36. An objective comprising:
a focusing lens group comprising at least one focusing lens receiving light energy and transmitting focused light energy;
a field lens group comprising at least one field lens receiving said focused light energy and transmitting intermediate light energy; and
a Mangin mirror group comprising at least one Mangin mirror element having diameter less than 100 millimeters receiving said intermediate light energy and providing controlled light energy through an immersion substance to a specimen, said Mangin mirror group positioned between the field lens group and the specimen, and at least one Mangin mirror element having a flat surface positioned adjacent the immersion substance and at least one Mangin mirror element in the Mangin mirror group comprises two reflective surfaces;
wherein all components of said Mangin mirror group, the field lens group, and the focusing lens group aligned along a single received light energy axis and further wherein the two reflective surfaces of the at least one Mangin mirror element in the Mangin mirror group are mirrored surfaces separated by a nonzero distance along the received light energy axis.

37. The objective of claim 36, wherein said objective has a field size of approximately 0.15 mm.

38. The objective of claim 36, configured to have a numerical aperture of approximately 1.2.

39. The objective of claim 36, wherein each lens used in the objective has a diameter of less than approximately 25 millimeters.

40. The objective of claim 36, said objective used with a microscope having a flange, wherein the flange may be located at least approximately 45 millimeters from the specimen during normal operation.

41. The objective of claim 40, wherein the flange may be located at least approximately 100 millimeters from the specimen during normal operation.

42. The objective of claim 36, wherein only two glass materials are used.

43. The objective of claim 36, wherein the immersion substance is water.

44. The objective of claim 36, wherein the immersion substance is oil.

45. The objective of claim 36, wherein the immersion substance is silicone gel.

46. The objective of claim 36, wherein the objective is optimized to produce minimum spherical aberration, axial color, and chromatic variation of aberrations.

47. The objective of claim 36, wherein the at least one mangin minor element is optimized to produce spherical, axial color, and chromatic variation of aberrations to compensate for aberrations induced by the focusing lens group.

48. An objective comprising:
a focusing lens group comprising at least one focusing lens receiving said light energy and transmitting focused light energy;
a field lens group comprising at least one field lens receiving said focused light energy and transmitting intermediate light energy; and
a Mangin mirror group comprising at least one Mangin minor element having diameter less than 100 millimeters, said Mangin mirror group receiving said intermediate light energy and providing controlled light energy through an immersion substance to a specimen, said Mangin mirror group positioned between the field lens group and the specimen, wherein at least one Mangin mirror element comprises a flat surface oriented proximate the immersion substance, and at least one Mangin mirror element in the Mangin minor group comprises two reflective surfaces;
wherein said Mangin mirror group, said focusing lens group, and said field lens group are aligned along a single received light energy axis and further wherein the two reflective surfaces of the at least one Mangin mirror element in the Mangin mirror group are mirrored surfaces separated by a nonzero distance along the received light energy axis.

49. The objective of claim 48, wherein said objective has a field size of approximately 0.15 mm.

50. The objective of claim 48, wherein the Mangin mirror group comprises:
a single lens/mirror element comprising:
a substantially curved concave surface; and
a second minimally curved surface;
wherein both surfaces of the single lens/mirror element are reflective with small central apertures through which light energy may pass.

51. The objective of claim 48, said objective having a numerical aperture of greater than approximately 1.0 at the specimen.

52. The objective of claim 48, wherein each lens in the objective has a diameter of less than approximately 25 millimeters.

53. The objective of claim 48, said objective having an ability to be employed with a microscope having a flange, wherein the flange may be located less than no more than approximately 45 millimeters from the specimen during normal operation.

54. The objective of claim 48, said objective employing no more than two glass materials.

55. The objective of claim 54, wherein the no more than two glass materials comprise fused silica and calcium fluoride.

56. The objective of claim 48, wherein the immersion substance comprises one from a group comprising water, oil, and silicone gel.

57. The objective of claim 48, configured to have a numerical aperture of approximately 1.2.

* * * * *